United States Patent
Hu et al.

(10) Patent No.: US 11,646,550 B2
(45) Date of Patent: May 9, 2023

(54) OPTICAL AMPLIFIER AND IMAGE CAPTURING DEVICE

(71) Applicant: ZHEJIANG DAHUA TECHNOLOGY CO., LTD., Zhejiang (CN)

(72) Inventors: Jing Hu, Hangzhou (CN); Ruobin Xia, Hangzhou (CN); Jie Zhang, Hangzhou (CN)

(73) Assignee: ZHEJIANG DAHUA TECHNOLOGY CO., LTD., Hangzhou (CN)

( * ) Notice: Subject to any disclaimer, the term of this patent is extended or adjusted under 35 U.S.C. 154(b) by 441 days.

(21) Appl. No.: 16/824,919

(22) Filed: Mar. 20, 2020

(65) Prior Publication Data
US 2020/0220335 A1 Jul. 9, 2020

Related U.S. Application Data

(63) Continuation of application No. PCT/CN2018/106943, filed on Sep. 21, 2018.

(30) Foreign Application Priority Data

Sep. 22, 2017 (CN) .......................... 201710864063.5

(51) Int. Cl.
*H04B 10/00* (2013.01)
*H01S 5/50* (2006.01)
(Continued)

(52) U.S. Cl.
CPC ................ *H01S 5/50* (2013.01); *H01S 5/141* (2013.01); *H01S 5/11* (2021.01)

(58) Field of Classification Search
CPC ... H04B 10/11; H04B 10/112; H04B 10/1121; H04B 10/1123; H04B 10/1125;
(Continued)

(56) References Cited

U.S. PATENT DOCUMENTS 8,749,879 B2 6/2014 Tanaka
9,548,588 B1 1/2017 Brown et al.
(Continued)

FOREIGN PATENT DOCUMENTS

CN 1734341 A 2/2006
CN 101741005 A 6/2010
(Continued)

OTHER PUBLICATIONS

International Search Report in PCT/CN2018/106943 dated Dec. 27, 2018, 4 pages.
(Continued)

*Primary Examiner* — Daniel G Dobson
(74) *Attorney, Agent, or Firm* — Metis IP LLC

(57) ABSTRACT

The present disclosure relates to an optical amplifier configured for an image capturing device. The optical amplifier may include a substrate. The optical amplifier may also include an optical amplification region formed over the substrate. The optical amplification region may include a first optical amplification layer and a second optical amplification layer. The first optical amplification layer may be configured to amplify light at a first wavelength range, and the second optical amplification layer may be configured to amplify light at a second wavelength range. The optical amplifier may further include at least one electrode layer electrically contacting the optical amplification region.

19 Claims, 13 Drawing Sheets

(51) Int. Cl.
  *H01S 5/14* (2006.01)
  *H04J 14/00* (2006.01)
  *H01S 5/11* (2021.01)

(58) Field of Classification Search
  CPC ............ H04B 10/1127; H04B 10/1129; H04B 10/114; H04B 10/1141; H04B 10/1143; H04B 10/1149; H04B 10/116
  See application file for complete search history.

(56) References Cited

U.S. PATENT DOCUMENTS

| | | | |
|---|---|---|---|
| 9,559,495 B1* | 1/2017 | Koenck | H01L 27/14625 |
| 10,084,283 B1* | 9/2018 | Jensen | H01S 5/50 |
| 2005/0271384 A1 | 12/2005 | Lee et al. | |
| 2012/0043569 A1 | 2/2012 | Mitsuishi et al. | |
| 2013/0140442 A1 | 6/2013 | Yanagita et al. | |
| 2017/0084761 A1 | 3/2017 | Cho et al. | |

FOREIGN PATENT DOCUMENTS

| | | |
|---|---|---|
| CN | 105156985 A | 12/2015 |
| CN | 105242481 A | 1/2016 |
| CN | 107680978 A | 2/2018 |
| WO | 2016135249 A1 | 9/2016 |

OTHER PUBLICATIONS

Written Opinion in PCT/CN2018/106943 dated Dec. 27, 2018, 5 pages.
First Office Action in Chinese Application No. 201710864063.5 dated Jul. 24, 2019, 11 pages.
The Extended European Search Report in European Application No. 18859400.6 dated Sep. 28, 2020, 9 pages.

* cited by examiner

OPTICAL AMPLIFIER AND IMAGE CAPTURING DEVICE

CROSS-REFERENCE TO RELATED APPLICATIONS

This application is a continuation of International Patent Application No. PCT/CN2018/106943 field on Sep. 21, 2018, which claims priority to Chinese Application No. 201710864063.5, filed on Sep. 22, 2017, the entire contents of which are hereby incorporated by reference.

TECHNICAL FIELD

The present disclosure generally relates to low light imaging techniques, and in particular, to an optical amplifier and an image capturing device.

BACKGROUND

In general, light in the night is insufficient in some occasions, such as residential areas, office buildings, campuses, highways, etc. Thus, low light imaging is very common in image acquisition or video monitoring applications. Images captured in the low light may have poor quality, for example, low brightness, poor contrast. Such images cannot be used for video monitoring. In order to obtain images with high quality, an image capturing device (e.g., a camera) may be required to meet the requirement for low light imaging.

At present, an electron multiplying charge coupled device (EMCCD) has been used to implement the low light imaging. FIG. 12A is a schematic diagram of an EMCCD. An image section, a store section and a readout register of the EMCCD may be similar to that of a charge coupled device (CCD). Compared with the CCD, a multiplication register may be added after the readout register. A charge detection node and an output may be connected to the multiplication register. A high electric field may be applied to the multiplication register. Under the action of the high electric field, carriers (or electrons) may undergo impact ionization to generate new carriers. In some embodiments, the generated carriers may be further induced to generate new carriers. Thus, electrical signals may be amplified, which may implement the low light imaging. In addition, a higher gain may be achieved by cascading a plurality of multiplication registers. For example, a camera of AndoriXon888 model may provide a linear gain of more than 300 times.

To illustrate the amplification principle of the multiplication register, FIG. 12B is a schematic diagram illustrating a process of charge transfer in the multiplication register. A multiplication element of the multiplication register may include four gates, three of which are clocked (e.g., $\phi 3$, $\phi 1$, $\phi 2$). $\phi 3$ and $\phi 1$ may be clocked with standard amplitude drive pulses (roughly 10 V). The pulses applied to $\phi 2$ of the multiplication register may have a higher amplitude, e.g., 40-45 V. A gate ($\phi dc$) may be placed prior to $\phi 2$, which is held at a low dc voltage. The electron potential difference between the $\phi dc$ and the $\phi 2$ may be sufficiently high so that electrons can undergo impact ionization processes when the electrons are transferred from $\phi 1$ to $\phi 2$. Thus, the number of electrons in the charge packet may increase as it passes through the multiplication element, which may amplify the electrical signals. It should be noted that, photosensitive elements of the EMCCD may be similar to that of CCD and may result in blooming, which may affect imaging quality.

Low-light level night vision device is a low-light imaging device that is frequently utilized. FIG. 12C is a schematic diagram of a low-light level night vision. As shown in FIG. 12C, the low-light level night vision may include a fiber optic panel, a photocathode, an electron multiplication region, and a phosphor screen. The incident light signals may be converted into electrons using the photocathode mounted on the fiber optic panel. The electrons may be multiplied by the high electric field region (i.e., the electron multiplication region). The electrons may be focused by a focusing cone electrode in the electron multiplication region and be transmitted to the phosphor screen. Electro-optical conversion may be performed by the phosphor screen to generate a visible light image. Thus, the incident light signals may be amplified. In some embodiments, the incident light signals may be amplified by multiple stages (e.g., three stages, five stages, ten stages, etc.). For example, as illustrated in FIG. 12C, there are three stages, i.e., first stage, second stage, third stage. The voltage in the first stage may be 15 kV. The voltage in the second stage may also be 15 kV (i.e., 30 kV-15 kV), and the voltage in the third stage may also be 15 kV (i.e., 45 kV-30 kV). The incident light signals may be amplified by the three stages. It should be noted that the low-light level night vision device cannot implement color imaging directly. Besides, the resolution of the low-light level night vision device may be only about 50 line pair/millimeter (lp/mm), which may not meet the requirement of the low light color imaging.

SUMMARY

In one aspect of the present disclosure, an optical amplifier is provided. The optical amplifier may be configured for an image capturing device. The optical amplifier may include a substrate, an optical amplification region formed over the substrate, and at least one electrode layer electrically contacting the optical amplification region. The optical amplification region may include a first optical amplification layer and a second optical amplification layer. The first optical amplification layer may be configured to amplify light at a first wavelength range, and the second optical amplification layer may be configured to amplify light at a second wavelength range.

In some embodiments, the optical amplification region may further include a third optical amplification layer. The third optical amplification layer may be configured to amplify light at a third wavelength range.

In some embodiments, at least two of the optical amplification layers may be formed of different semiconductor materials.

In some embodiments, optical amplification of at least one of the optical amplification layers may be provided by electrically injecting via the at least one electrode layer to excite electrons in the semiconductor materials from low energy level to high energy level.

In some embodiments, each of the at least one electrode layer may include two electrodes respectively disposed over two sides of one of the optical amplification layers.

In some embodiments, the at least one electrode layer may be formed of an (optically) transparent material.

In some embodiments, the at least one electrode layer may have a porous structure. At least one of the optical amplification layers may be formed over the substrate through the porous structure of the at least one electrode layer.

In some embodiments, the porous structure may include a cross-shaped porous structure, stripped porous structure.

In some embodiments, at least some of the optical amplification layers may be arranged in a layer pattern, or in a Bayer pattern, or in a mash pattern.

In some embodiments, the optical amplifier may further include an anti-reflection layer formed on a first end face of the optical amplifier, on which light is incident.

In some embodiments, the optical amplifier may further include an anti-reflection layer formed on a second end face of the optical amplifier, from which the light is output.

In some embodiments, the optical amplifier may further include a mirror reflection layer formed on an end face of the optical amplifier.

In some embodiments, the optical amplifier may further include a partially reflection layer formed on a first end face of the optical amplifier, on which light is incident.

In some embodiments, the optical amplifier may further include a partially reflection layer formed on a second end face of the optical amplifier, from which the light is output.

In some embodiments, the first wavelength range may not overlap with the second wavelength range.

In some embodiments, the second wavelength range and the third wavelength range may at least partially overlap with each other.

In another aspect of the present disclosure, an image capturing device is provided. The image capturing device may include imaging optics, and at least one optical amplifier. The imaging optics may be configured to focus light onto an image sensor. The at least one optical amplifier may be configured to amplify the light impinging on the at least one optical amplifier. The image sensor may be configured to receive and detect the amplified light.

In some embodiments, a center of each of the at least one optical amplifier may be aligned with a center of the image sensor.

In some embodiments, at least one of the at least one optical amplifier may be a semiconductor optical amplifier.

In some embodiments, the semiconductor optical amplifier may include a substrate, an optical amplification region formed over the substrate, and at least one electrode layer electrically contacting the optical amplification region. The optical amplification region may include a first optical amplification layer and a second optical amplification layer. The first optical amplification layer may be configured to amplify light at a first wavelength range, and the second optical amplification layer may be configured to amplify light at a second wavelength range.

In some embodiments, the optical amplification region may further include a third optical amplification layer. The third optical amplification layer may be configured to amplify light at a third wavelength range.

In some embodiments, at least two of the optical amplification layers may be formed of different semiconductor materials.

In some embodiments, each of the at least one electrode layer may include two electrodes respectively disposed over two sides of one of the optical amplification layers.

In some embodiments, the at least one electrode layer may be formed of an (optically) transparent material.

In some embodiments, one of the at least one optical amplifier may include an anti-reflection layer formed on a first end face of the optical amplifier, on which light is incident.

In some embodiments, one of the at least one optical amplifier may include an anti-reflection layer formed on a second end face of the optical amplifier, from which the light is output.

In some embodiments, one of the at least one optical amplifier may include a mirror reflection layer formed on an end face of the optical amplifier.

In some embodiments, one of the at least one optical amplifier may include a partially reflection layer formed on a first end face of the optical amplifier, on which light is incident.

In some embodiments, one of the at least one optical amplifier may include a partially reflection layer formed on a second end face of the optical amplifier, from which the light is output.

In some embodiments, a plane of the at least one optical amplifier may be parallel to a plane of the image sensor.

In some embodiments, a plane of the at least one optical amplifier and a plane of the image sensor may form an angle.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting schematic embodiments, in which like reference numerals represent similar structures throughout the several views of the drawings, and wherein.

DETAILED DESCRIPTION

Figure 1:
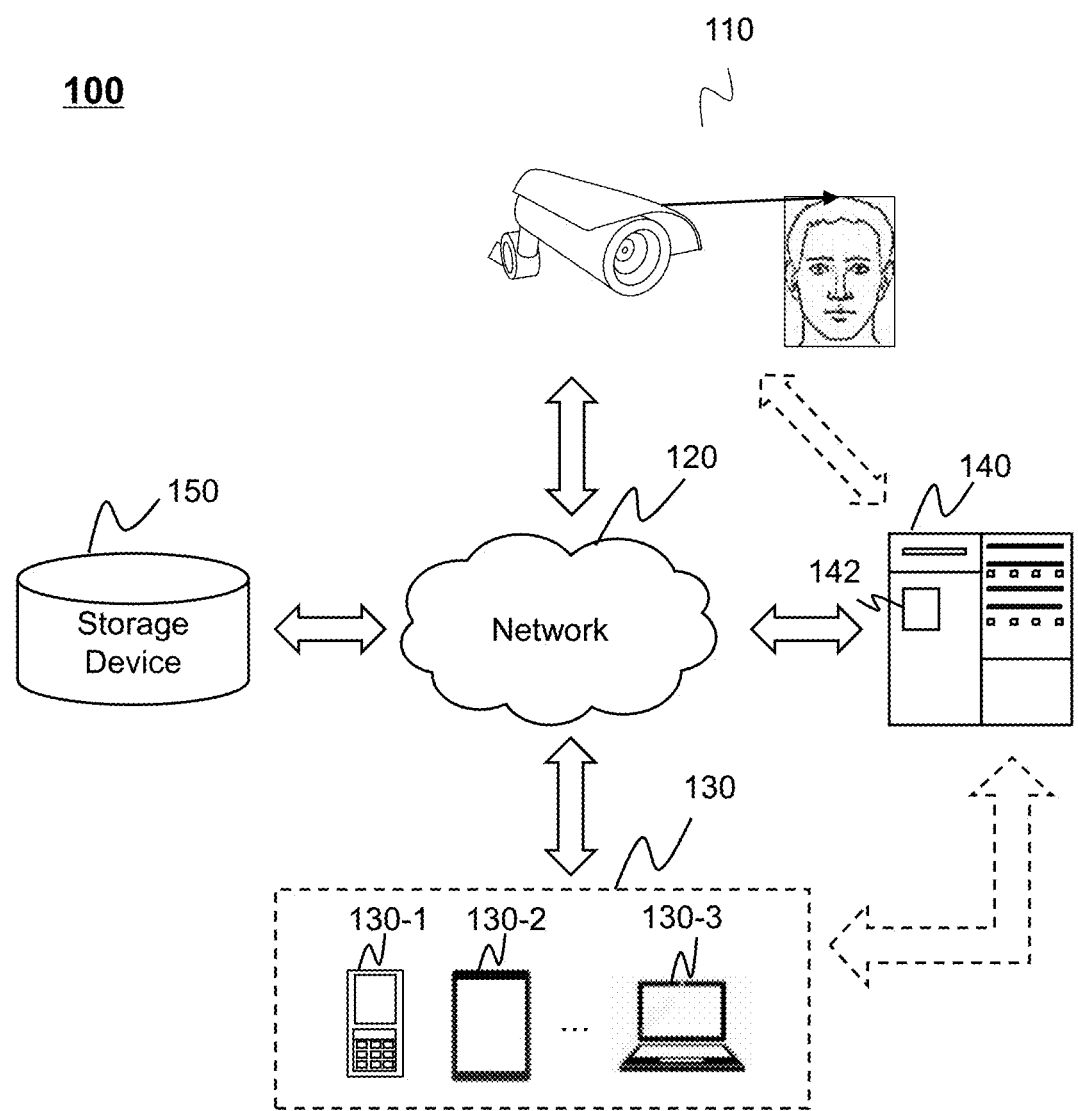
FIG. 1 is a schematic diagram illustrating an exemplary image processing system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a", "an", and "the" may be intended to include the plural forms as well, unless the context clearly indicates otherwise. It will be further understood that the terms "comprise", "comprises", and/or "comprising", "include", "includes", and/or "including", when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

The modules (or units, blocks, units) described in the present disclosure may be implemented as software and/or hardware modules and may be stored in any type of non-transitory computer-readable medium or other storage device. In some embodiments, a software module may be compiled and linked into an executable program. It will be appreciated that software modules can be callable from other modules or from themselves, and/or can be invoked in response to detected events or interrupts. Software modules configured for execution on computing devices can be provided on a computer readable medium, such as a compact disc, a digital video disc, a flash drive, a magnetic disc, or any other tangible medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedded in a firmware, such as an EPROM. It will be further appreciated that hardware modules (e.g., circuits) can be included of connected or coupled logic units, such as gates and flip-flops, and/or can be included of programmable units, such as programmable gate arrays or processors. The modules or computing device functionality described herein are preferably implemented as hardware modules, but can be software modules as well. In general, the modules described herein refer to logical modules that can be combined with other modules or divided into units despite their physical organization or storage.

Generally, the word "module," "sub-module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts.

Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in a firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure.

The present disclosure provides an optical amplifier. The optical amplifier may be configured for an image capturing device. The optical amplifier may include a substrate, an optical amplification region formed over the substrate, and at least one electrode layer electrically contacting the optical amplification region. The optical amplification region may include a first optical amplification layer (e.g., a red amplification layer) configured to amplify light at a first wavelength range, a second optical amplification layer (e.g., a green amplification layer) configured to amplify light at a second wavelength range, and a third optical amplification layer (e.g., a blue amplification layer) configured to amplify light at a third wavelength range. In some embodiments, the optical amplifier may amplifier different components (e.g., the red light, the green light and/or the blue light) in incident light, which may facilitate color imaging of the image capturing device under low light conditions.

The present disclosure also provides an image capturing device for low light imaging. The image capturing device may enable color imaging in low light, even in ultra-low light. The image capturing device may include an imaging optics, at least one optical amplifier and an image sensor. The imaging optics may be configured to focus light onto the image sensor. The at least one optical amplifier may be configured to amplify the light impinging on the at least one optical amplifier. The image sensor may be configured to receive and detect the amplified light. In some embodiments, to improve the imaging quality, a center of each of the at least one optical amplifier may be aligned with a center of the image sensor.

FIG. 1 is a schematic diagram illustrating an exemplary image processing system 100 according to some embodiments of the present disclosure. The image processing system 100 may include an image capturing device 110, a network 120, a terminal 130, a processing device 140, and a storage device 150.

The image capturing device 110 may be configured to capture one or more images. As used in this application, an image may be a still image, a video, a stream video, or a video frame obtained from a video. The image may be a three-dimensional (3D) image or a two-dimensional (2D) image. The image capturing device 110 may be or include one or more cameras. In some embodiments, the image capturing device 110 may be a digital camera, a video camera, a security camera, a web camera, a smartphone, a tablet, a laptop, a video gaming console equipped with a web camera, a camera with multiple lenses, a camcorder, etc. In some embodiments, the image capturing device 110 (e.g., a camera) may capture an image under low light conditions.

The network 120 may facilitate the exchange of information and/or data. In some embodiments, one or more components of the image processing system 100 (e.g., the image capturing device 110, the terminal 130, the processing device 140, the storage device 150) may send information and/or data to another component(s) in the image processing system 100 via the network 120. For example, the processing device 140 may process an image obtained from the image capturing device 110 via the network 120. As another example, the image capturing device 110 may obtain user instructions from the terminal 130 via the network 120. In some embodiments, the network 120 may be any type of wired or wireless network, or combination thereof. Merely by way of example, the network 120 may include a cable network, a wireline network, an optical fiber network, a telecommunications network, an intranet, an Internet, a local area network (LAN), a wide area network (WAN), a wireless local area network (WLAN), a metropolitan area network (MAN), a wide area network (WAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired or wireless network access points such as base stations and/or internet exchange points 120-1, 120-2, . . . , through which one or more components of the image processing system 100 may be connected to the network 120 to exchange data and/or information.

The terminal 130 include a mobile device 130-1, a tablet computer 130-2, a laptop computer 130-3, or the like, or any combination thereof. In some embodiments, the mobile device 130-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, footgear, eyeglasses, a helmet, a watch, clothing, a backpack, an accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass™, an Oculus Rift™, a HoloLens™, a Gear VR™, etc. In some embodiments, the terminal 130 may remotely operate the image capturing device 110. In some embodiments, the terminal 130 may operate the image capturing device 110 via a wireless connection. In some embodiments, the terminal 130 may receive information and/or instructions inputted by a user, and send the received information and/or instructions to the image capturing device 110 or to the processing device 140 via the network 120. In some embodiments, the terminal 130 may be part of the processing device 140. In some embodiments, the terminal 130 may be omitted.

In some embodiments, the processing device 140 may process data obtained from the image capturing device 110, the terminal 130, or the storage device 150. For example, the processing device 140 may obtain one or more images captured by the image capturing device 110, and process the obtained images. The processing device 140 may be a central processing unit (CPU), a digital signal processor (DSP), a system on a chip (SoC), a microcontroller unit (MCU), or the like, or any combination thereof. In some embodiments, the processing device 140 may be a single server or a server group. The server group may be centralized or distributed. In some embodiments, the processing device 140 may be local to or remote from one or more other components of the image processing system 100. For example, the processing device 140 may access information and/or data stored in the image capturing device 110, the terminal 130, and/or the storage device 150 via the network 120. As another example, the processing device 140 may be directly connected to the image capturing device 110, the terminal 130, and/or the storage device 150, to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The storage device 150 may store data and/or instructions. In some embodiments, the storage device 150 may store data or images obtained from the image capturing device 110, the terminal 130 and/or the processing device 140. In some embodiments, the storage device 150 may store data and/or instructions that the processing device 140 may execute or use to perform exemplary methods described in the present disclosure. In some embodiments, the storage device 150 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components of the image processing system 100 (e.g., the image capturing device 110, the terminal 130, the processing device 140). One or more components in the image processing system 100 may access the data or instructions stored in the storage device 150 via the network 120. In some embodiments, the storage device 150 may be directly connected to or communicate with one or more components in the image processing system 100 (e.g., the image capturing device 110, the terminal 130, the processing device 140). In some embodiments, the storage device 150 may be part of the image capturing device 110, or the processing device 140.

Figure 2:
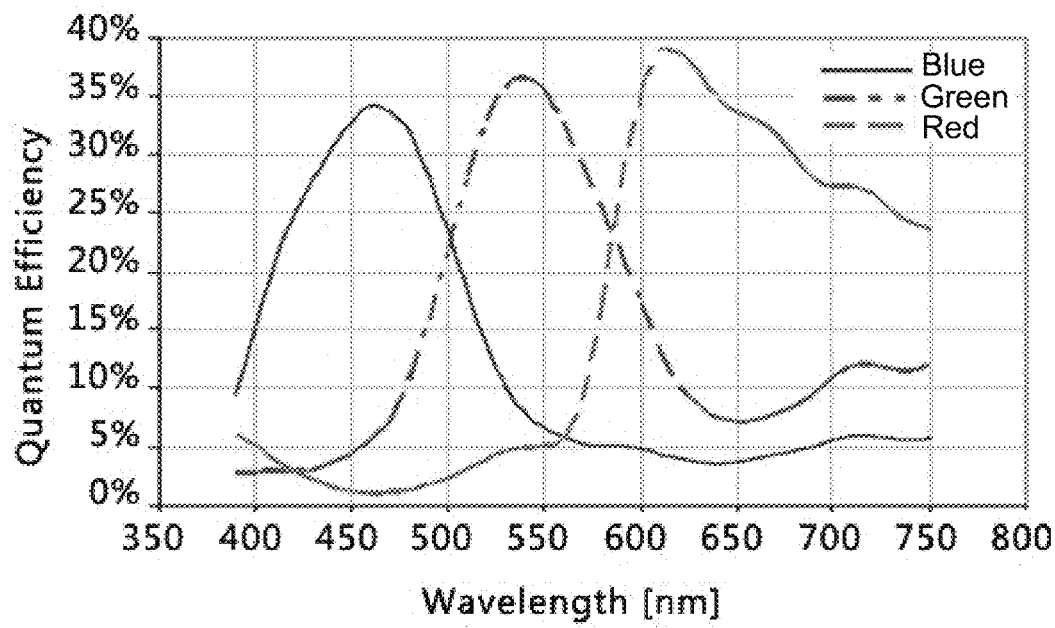
FIG. 2 shows a spectral response diagram of an image sensor according to some embodiments of the present disclosure.

The present disclosure provides an optical amplifier. The optical amplifier may be configured for an image capturing device. In some embodiments, the optical amplifier may be fabricated to match with an image sensor of the image capturing device. The image sensor may include a charge-coupled device (CCD), a complementary metal-oxide semiconductor (CMOS), or the like, or any combination thereof. In some embodiments, the size of the optical amplifier may match with the size of the image sensor. Specifically, the size of the optical amplifier may be greater than or equal to the size of the image sensor. For example, the image sensor may have a size of 8.47 mm*8.47 mm (⅓ in), and the optical amplifier may have a size of 10 mm*10 mm. In some embodiments, the color(s) of light to be amplified by the optical amplifier may depend on the photosensitive elements of the image sensor. Merely by way of example, FIG. 2 shows a spectral response diagram of an image sensor according to some embodiments of the present disclosure. As shown in FIG. 2, the abscissa axis represents wavelength, and the vertical axis represents quantum efficiency (QE) of different wavelengths. The QE may indicate an efficiency of converting a photon to an electron. The spectral response diagram includes three spectral response curves corresponding to three photosensitive elements. In some embodiments, a spectral response curve of a photosensitive element may reflect the change of responsiveness of the photosensitive element with wavelength. As shown in FIG. 2, the photosensitive element corresponding to blue light has a higher QE at the blue wavelength range than other wavelength ranges. Similarly, the photosensitive element corresponding to green light has a higher QE at the green wavelength range than other wavelength ranges. The photosensitive element corresponding to red light has a higher QE at the red wavelength range than other wavelength ranges. According to the responsiveness of different photosensitive elements with different wavelengths, the optical amplifier may amplify light with different wavelengths. For example, to match with the image sensor (specifically, the photosensitive elements of the image sensor), the three colors of light (i.e., the red light, the green light, the blue light) may be amplified by the optical amplifier. It should be noted that the photosensitive elements of the image sensor may correspond to other colors other than the three colors. Accordingly, the color(s) of light to be amplified by the optical amplifier may be not limited to the three colors.

Figure 3:
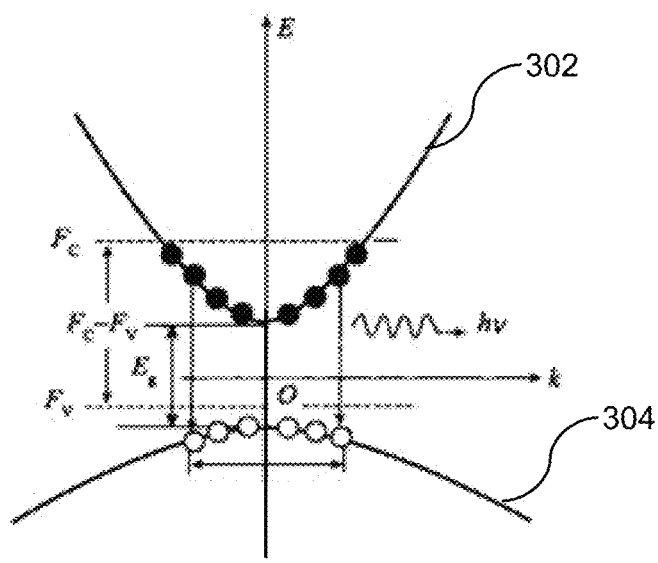
FIG. 3 is a schematic diagram illustrating optical amplification of a semiconductor material according to some embodiments of the present disclosure.

In some embodiments, the optical amplification of the optical amplifier may be realized by a process of stimulated emission of direct bandgap materials (e.g., semiconductor materials) which is induced by population inversion. The population inversion may refer to a result that the number of electrons on a high energy level (e.g., conduction band) is larger than that on a low energy level (e.g., valence band). In some embodiments, the population inversion may be achieved by supplying an additional energy in a suitable form to pump a plurality of electrons from the low energy level (e.g., the valence band) to the high energy level (e.g., the conduction band). For example, electrons in the semiconductor materials may be excited from the low energy level (e.g., the valence band) to the high energy level (e.g., the conduction band) by an electrically injecting process via an electrode. In some embodiments, when the population inversion is satisfied, photons impinging on the semiconductor materials may induce electrons in the semiconductor materials from the high energy level (e.g., the conduction band) to the low energy level (e.g., the valence band), which may release energy. The released energy may be converted to photons, thus implementing optical amplification. It should be noted that different semiconductor materials may amplify light with different wavelength ranges. For example, blue light and green light may be amplified by the same semiconductor materials (GaN) with different component ratios. Red light may be amplified by GaP. Merely by way of example, FIG. 3 is a schematic diagram illustrating the optical amplification of a semiconductor material according to some embodiments of the present disclosure. The abscissa axis represents the wave vector k, and the vertical axis represents the energy of electrons. The energy of electrons may vary as a function of the wave vector k. As shown in FIG. 3, parabola 302 represents the energy of a conduction band, and parabola 304 represents the energy of a valence band. Solid dots represent electrons, and hollow circles represent electron holes. The conduction band may include more electrons than the valence band. Fc represents a characteristic energy (e.g., the statistical energy) of electrons on the conduction band, and Fv represents a characteristic energy (e.g., the statistical energy) of electrons on the valence band. When the difference between Fc and Fv, i.e., Fc-Fv, exceeds a threshold, the population inversion is satisfied. The threshold may depend on the property of the semiconductor material. When a first number of photons impinge on the semiconductor material, at least part of the electrons on the conduction band may be induced to jump to the valence band and release energy Ez. The released energy Ez may be converted to a second number of photons. The second number may be larger than the first number. The photons converted from the energy Ez may satisfy a condition, that is, Ez=hv. h represents the Planck constant, and v represents the frequency of the photons. It shall be noted that the second number of photons may have same or similar frequency as that of the first number of photons. Thus, light with a certain wavelength that corresponds to a certain frequency may be amplified by the semiconductor material.

In some embodiments, the optical amplifier may include an optical amplification region. The optical amplification region may be in a form of quantum well (QW), or a p-n junction, or the like. In some embodiments, the optical amplification region may be formed by one or more amplification layers. Each amplification layer may be configured to amplify a specific component of light. For example, the optical amplification region may include a first optical amplification layer, a second amplification layer, and a third amplification layer. The first optical amplification layer may be configured to amplify light at a first wavelength range. The second optical amplification layer may be configured to amplify light at a second wavelength range. The third optical amplification layer may be configured to amplify light at a third wavelength range.

In some embodiments, the three wavelength ranges may not overlap with each other. For example, the lower limit of the first wavelength range may be greater than the upper limit of the second wavelength range. The lower limit of the second wavelength range may be greater than the upper limit of the third wavelength range. Specifically, the difference between the lower limit of the first wavelength range and the upper limit of the second wavelength range may be greater than a first threshold (e.g., 5 nm, 10 nm, 15 nm, 25 nm, 35 nm, 45 nm) The difference between the lower limit of the second wavelength range and the upper limit of the third wavelength range may be greater than a second threshold (e.g., 5 nm, 10 nm, 15 nm, 20 nm, 30 nm, 40 nm) In some embodiments, the first wavelength range may correspond to red light, and the first wavelength range may be or at least include the range of 760-622 nm. The second wavelength range may correspond to green light, and the second wavelength range may be or at least include the range of 577-492 nm. The third wavelength range may correspond to blue light, and the third wavelength range may be or at least include the range of 450-435 nm. In some embodiments, two of the three wavelength ranges may at least partially overlap with each other. For example, the first wavelength range may not overlap with the second wavelength range, and a portion of the second wavelength range may overlap with a portion of the third wavelength range. For example, the lower limit of the first wavelength range may be greater than the upper limit of the second wavelength range. The lower limit of the second wavelength range may be less than or equal to the upper limit of the third wavelength range. Specifically, the difference between the lower limit of the first wavelength range and the upper limit of the second wavelength range may be greater than a third threshold (e.g., 5 nm, 10 nm, 15 nm, 25 nm, 35 nm, 45 nm) The difference between the upper limit of the third wavelength range and the lower limit of the second wavelength range (i.e., the overlapped portion of the second wavelength range and the third wavelength range) may be less than a fourth threshold (e.g., 2 nm, 5 nm, 7 nm, 10 nm, 20 nm, 30 nm, 100 nm, 150 nm, 200 nm, 300 nm). In some embodiments, each two of the three wavelength ranges may overlap with each other. For example, a portion of the first wavelength range may overlap with a portion of the second wavelength range, and a portion of the second wavelength range may overlap with a portion of the third wavelength range. For example, the lower limit of the first wavelength range may be less than or equal to the upper limit of the second wavelength range. The lower limit of the second wavelength range may be less than or equal to the upper limit of the third wavelength range. Specifically, the difference between the upper limit of the second wavelength range and the lower limit of the first wavelength range (i.e., the overlapped portion of the first wavelength range and the second wavelength range) may be less than a fifth threshold (e.g., 2 nm, 5 nm, 7 nm, 10 nm, 20 nm, 30 nm, 100 nm, 150 nm, 200 nm, 300 nm). The difference between the upper limit of the third wavelength range and the lower limit of the second wavelength range (i.e., the overlapped portion of the second wavelength range and the third wavelength range) may be less than a sixth threshold (e.g., 2 nm, 5 nm, 7 nm, 10 nm, 20 nm, 30 nm, 100 nm, 150 nm, 200 nm, 300 nm). In some embodiments, the difference between the center wavelength of the first wavelength range and the center wavelength of the second wavelength range may be greater than a seventh threshold (e.g., 20 nm, 50 nm, 70 nm, 80 nm, 100 nm, 130 nm, 150 nm, 200 nm, 300 nm). The difference between the center wavelength of the second wavelength range and the center wavelength of the third wavelength range may be greater than an eighth threshold (e.g., 20 nm, 50 nm, 70 nm, 80 nm, 100 nm, 130 nm, 150 nm, 200 nm, 300 nm). In some embodiments, at least two of the above-mentioned thresholds may be the same. Alternatively, at least two of the above-mentioned thresholds may be different.

In some embodiments, "amplifying light at a certain (e.g., the first, the second, the third) wavelength range" may refer to mainly amplifying light at the certain wavelength range, and seldom amplifying light beyond the certain wavelength range. For example, the first optical amplification layer may amplify light at the first wavelength range with a greater gain (e.g., 50 times) and amplify light at the second wavelength range with a smaller gain (e.g., 2 times). In some embodiments, at least two of the optical amplification layers are formed of different semiconductor materials. The semiconductor material of an optical amplification layer may be Group III-V materials, Group IV materials, Group II-VI materials, or the like. For example, the semiconductor material may be GaN (gallium nitride), GaP (gallium phosphide), InGaN (indium gallium nitride), InGaP (indium gallium phosphide), or the like. It should be noted that the number of optical amplification layers in the optical amplification region is merely provided for illustration purposes, and is not intended to limit the scope of the present disclosure. In some embodiments, the optical amplification region may include any number of optical amplification layers, for example, two amplification layers, four amplification layers, seven amplification layers, or the like.

Figure 5:
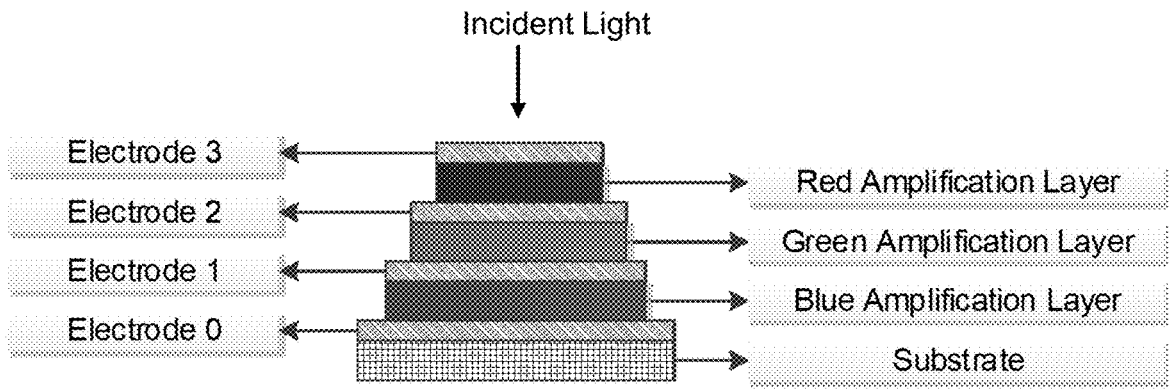
FIG. 5 is a schematic diagram of an exemplary optical amplifier according to some embodiments of the present disclosure.

In some embodiments, at least some of the optical amplification layers may be arranged in a layer pattern or in a Bayer pattern. The layer pattern may refer to that two or more optical amplification layers may be arranged along a direction perpendicular to the plane of the two or more optical amplification layers, as shown in FIG. 5. For the layer pattern, if the incident direction of incident light is perpendicular to the plane of optical amplification layers (e.g., see FIG. 5), the incident light may orderly pass the optical amplification layers (e.g., the red amplification layer, the green amplification layer, the blue amplification layer in sequence as illustrated in FIG. 5), and may orderly be amplified by the optical amplification layers. The Bayer pattern may refer to that two or more optical amplification layers (also referred to as optical amplification elements) may be located in the same plane, and may be arranged with an interleaving pattern (e.g., see FIGS. 6A to 6C). For the Bayer pattern, if the incident direction of incident light is perpendicular to the plane of optical amplification layers (e.g., see FIGS. 6B and 6C), different portions of the incident light may pass through different optical amplification layers, and may be amplified by the corresponding optical amplification layers. For example, a portion of the incident light may pass through the red amplification layer and be amplified by the red amplification layer. In some embodiments, the optical amplification layers may be arranged based on the arrangement of the photosensitive elements of the image sensor. Merely by way of example, if the photosensitive elements are arranged in a layer pattern or a stack pattern (e.g., a Foveon image sensor), the optical amplification layers may be arranged in the layer pattern, which will be described in FIG. 5. As another example, if the photosensitive elements are arranged in a Bayer pattern (e.g., a Bayer image sensor), the optical amplification layers (or optical amplification elements) may be arranged in the Bayer pattern, which will be described in FIGS. 6A to 6C. It should be noted that the optical amplification layers may be arranged in any other pattern, such as a mash pattern, a stripped pattern, or the like. The mash pattern may refer to that two or more optical amplification layers (also referred to as optical amplification elements) may be located in the same plane, and may be arranged randomly. The stripped pattern may refer to that two or more optical amplification layers (also referred to as optical amplification elements) may be located in the same plane, and may be arranged in a stripped pattern. For example, a first stripped area may be a red amplification layer, a second stripped area may be a green amplification layer, a third stripped area may be a blue amplification layer, a fourth stripped area may be a red amplification layer, . . . , or the like.

In some embodiments, the optical amplifier may include a substrate on which the optical amplification region is formed. For example, the optical amplification layers may be formed over the substrate. The substrate may be formed of materials such as sapphire, GaN, or the like. In some embodiments, the optical amplifier may include at least one electrode layer electrically contacting the optical amplification region. The at least one electrode layer may perform an electrically injecting process to the at least one of the optical amplification layers to induce electrons in the semiconductor material from low energy level (e.g., valence band) to high energy level (e.g., conduction band). In some embodiments, each of the at least one electrode layer may include two electrodes respectively disposed over two sides of one of the optical amplification layers.

In some embodiments, the at least one electrode layer may be formed of an optically transparent material, such as indium tin oxide (ITO), graphene, or the like. The optically transparent material may have high conductivity and high visible light transmittance, which may improve the gain of light impinging on the optical amplifier and further improve imaging quality. In some embodiments, the at least one electrode layer may be disposed over the substrate or the optical amplification layer(s) using a sputtering technique. Specifically, the at least one electrode layer may be sputtered on the substrate, each of the optical amplification layers. For those skilled in the art, other techniques may be used to dispose the at least one electrode layer over the substrate or the optical amplification layer(s). In some embodiments, at least one electrode layer may be layered between the substrate and at least one of the optical amplification layers. To better ensure the contact between the substrate and the at least one of the optical amplification layers, the at least one electrode layer may have a porous structure. Thus, the at least one of the optical amplification layers may be formed over the substrate through the slots of the porous structure of the at least one electrode layer. In some embodiments, the porous structure of the at least one electrode layer may be formed using an etching technique. The porous structure may have any suitable configuration, such as, a stripped porous structure (see FIGS. 4A and 4B), a cross-shaped porous structure (see FIG. 4C), or the like.

Figure 4A:
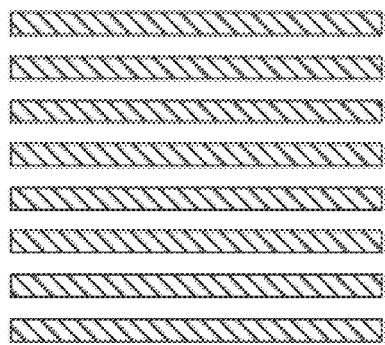
FIGS. 4A and 4B are schematic diagrams illustrating exemplary electrode layers with stripped porous structure according to some embodiments of the present disclosure.
Figure 4B:
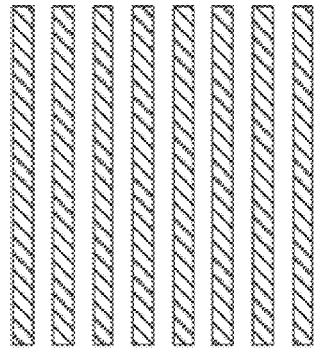
Figure 4C:
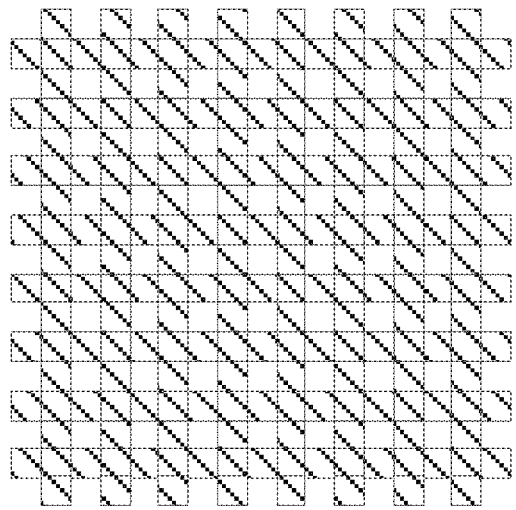
FIG. 4C is a schematic diagram illustrating an exemplary electrode layer with cross-shaped porous structure according to some embodiments of the present disclosure.

FIGS. 4A and 4B are schematic diagrams illustrating exemplary electrode layers with stripped porous structure according to some embodiments of the present disclosure. As shown in FIG. 4A, the electrode layer may include a horizontal stripped porous structure. As shown in FIG. 4B, the electrode layer may include a vertical stripped porous structure. The shaded regions in the FIGS. 4A and 4B may represent electrodes of an electrode layer, and the gaps between the shaded regions may form the porous structure of the electrode layer. An optical amplification layer may be formed over a substrate through the porous structure of the electrode layer. In some embodiments, to form high-quality optical amplification layers and a uniform electric field, the electrode layer with the horizontal stripped porous structure and the electrode layer with the vertical stripped porous structure may be arranged in an interlacing manner in the optical amplifier. For example, as shown in FIG. 5, electrode 1 and electrode 3 may have the horizontal stripped porous structure, and electrode 0 and electrode 2 may have the vertical stripped porous structure. As another example, as shown in FIG. 5, electrode 1 and electrode 3 may have the vertical stripped porous structure, and electrode 0 and electrode 2 may have the horizontal stripped porous structure. FIG. 4C is a schematic diagram illustrating an exemplary electrode layer with cross-shaped porous structure according to some embodiments of the present disclosure. The shaded regions in the FIG. 4C may represent electrodes of an electrode layer, and the holes between the shaded regions may form the porous structure of the electrode layer. An optical amplification layer may be formed over a substrate through the porous structure of the electrode layer. In some embodiments, each of the at least one electrode layer may have the cross-shaped porous structure. For example, as shown in FIG. 5, electrode 0, electrode 1, electrode 2 and electrode 3 may have the cross-shaped porous structure. In some embodiments, a portion of the at least one electrode layer may have the stripped porous structure, and other electrode layer(s) may have the cross-shaped pours structure. For example, as shown in FIG. 5, electrode 0 and electrode 1 may have the cross-shaped porous structure, electrode 2 may have the horizontal stripped porous structure, and electrode 3 may have the vertical stripped porous structure. It should be noted that, in order to generate the uniform electric field, the size of the holes or gaps on each electrode layer and the distance between two adjacent holes or gaps may be limited to a preset threshold.

In some embodiments, the lengths or the widths of the electrode layer(s), the optical amplification layer(s), and the substrate may be the same or different. It should be noted that the length and width of an electrode layer (or an optical amplification layer, or the substrate) may constitute a plane perpendicular to the incident direction of incident light. If the lengths or the widths of two optical amplification layers are different, the gains of light passing through the two optical amplification layers may be different. For example, for a semiconductor optical amplifier for amplifying infrared light, if an optical amplification layer has a length of 0.6 mm and a width of 0.002 mm, the gain of light passing through the optical amplification layer may be 1000 times/linear. For the optical amplifier disclosed in the present disclosure, an optical amplification layer may have a length of 7 mm and a width of 5 mm. When the incident light is visible light and the total number of pixels are 2 million, the gain of light passing through a pixel may be 15 times/linear. In other words, the gains of light passing through the pixel may be 23 times/db. In some embodiments, the gain of light passing through an optical amplification layer may also be controlled based on a current supplied to the electrodes on the two sides of the optical amplification layer. For example, if the current supplied to the electrode is changed, the gain of light passing through the optical amplification layer may be changed. It should be noted that the current supplied to the electrodes may need to be small enough so that the total gain of light may be less than the total loss of the light and a lasing may not occur in the optical amplification layer.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the at least one electrode layer may have any other porous structure, as long as the optical amplification layer(s) can be formed over the substrate through the porous structure.

In some embodiments, to fully understand the optical amplifier, an exemplary optical amplifier may be provided. FIG. 5 is a schematic diagram of an exemplary optical amplifier according to some embodiments of the present disclosure. As shown in FIG. 5, the optical amplifier may include three optical amplification layers (e.g., a red amplification layer, a green amplification layer, and a blue amplification layer), a substrate, a plurality of electrode layers (e.g., electrode 0, electrode 1, electrode 2, and electrode 3). The red amplification layer, the green amplification layer, and the blue amplification layer may be formed on the substrate and be arranged in a layer pattern. The plurality of electrode layers may be disposed over two sides of each optical amplification layer.

As shown in FIG. 5, the three optical amplification layers may be arranged in an order of the red amplification layer, the green amplification layer, and the blue amplification layer along the incident direction of the incident light. It should be noted that the three optical amplification layers may be arranged in other orders. For example, the three optical amplification layers may be arranged in an order of the blue amplification layer, the red amplification layer, and the green amplification layer along the incident direction of the incident light, in an order of the green amplification layer, the blue amplification layer, and the red amplification layer along the incident direction of the incident light, in an order of the green amplification layer, the red amplification layer, and the blue amplification layer along the incident direction of the incident light, in an order of the blue amplification layer, the green amplification layer, and the red amplification layer along the incident direction of the incident light, in an order of the red amplification layer, the blue amplification layer, and the green amplification layer along the incident direction of the incident light, or the like.

The three optical amplification layers of the optical amplifier may be formed of different direct bandgap materials (e.g., semiconductor materials), respectively. The direct bandgap materials (e.g., the semiconductor materials) may be excited by an additional energy (e.g., an electric field) to obtain effective population inversion. When incident light impinges on the optical amplifier, light with a certain wavelength range (e.g., red light, green light, blue light) may be amplified. In some embodiments, the semiconductor material of the red amplification layer may be GaP. Specifically, GaP-based III-N-V materials with 0.5% nitrogen (N) may be used to amplify the red light. The semiconductor material of the green amplification layer and the blue amplification layer may be GaN. The component ratios of Ga and N in the green amplification layer and the blue amplification layer may be different. In some embodiments, the lattice constant of GaP may be greatly different from the lattice constant of GaN. The red amplification layer may not be directly formed over the green amplification layer and/or the blue amplification layer. In some embodiments, the red amplification layer may be independently formed over an auxiliary substrate, and then bonded to the green amplification layer and the blue amplification layer via the auxiliary substrate. Thus, considering the simplicity of the fabrication process, the green amplification layer and the blue amplification layer may be arranged as two adjacent optical amplification layers, just as shown in FIG. 5.

As shown in FIG. 5, electrode 0 may be disposed over the substrate, electrode 1 may be disposed over the blue amplification layer, electrode 2 may be disposed over the green amplification layer, and electrode 3 may be disposed over the red amplification layer. The upper side and lower side of each of the optical amplification layers may be electrically connected with two electrodes, respectively. For example, electrode 1 may be on the upper side of the blue amplification layer, and electrode 0 may be on the lower side of the blue amplification layer. Electrode 2 may be on the upper side of the green amplification layer, and electrode 1 may be on the lower side of the green amplification layer. Electrode 3 may be on the upper side of the red amplification layer, and electrode 2 may be on the lower side of the red amplification layer. In some embodiments, the gain of an optical amplification layer may be controlled by controlling the current supplied to the electrodes on the two sides (e.g., the upper side and lower side) of the optical amplification layer. For example, the gain of the red amplification layer may be controlled by controlling the current supplied to electrode 2 and electrode 3.

In some embodiments, if incident light enters into the optical amplifier as indicated by the arrow illustrated in FIG. 5, the incident light may sequentially pass through electrode 3, the red amplification layer, electrode 2, the green amplification layer, electrode 1, the blue amplification layer, electrode 0, and the substrate. The red light in the incident light may be amplified by the red amplification layer. The green light in the incident light may be amplified by the green amplification layer. The blue light in the incident light may be amplified by the blue amplification layer.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. Apparently, the optical amplifier that includes the red amplification layer, the green amplification layer and the blue amplification layer is merely an embodiment of the present disclosure, and the optical amplifier may include any other optical amplification layer. For example, the optical amplifier may only include a first optical amplification layer amplifying light at a first wavelength range (e.g., wavelength range corresponding to red light) and a second optical amplification layer amplifying light at a second wavelength range (e.g., wavelength range ranging from green light to blue light). Besides, it should be noted that "amplifying light at a certain (e.g., the first, the second) wavelength range" may refer to mainly amplifying light at the certain wavelength range, and seldom amplifying light beyond the certain wavelength range. For example, the red optical amplification layer may amplify the red light with a greater gain (e.g., 50 times) and amplify light other than the red light with a smaller gain (e.g., 2 times).

Figure 6A:
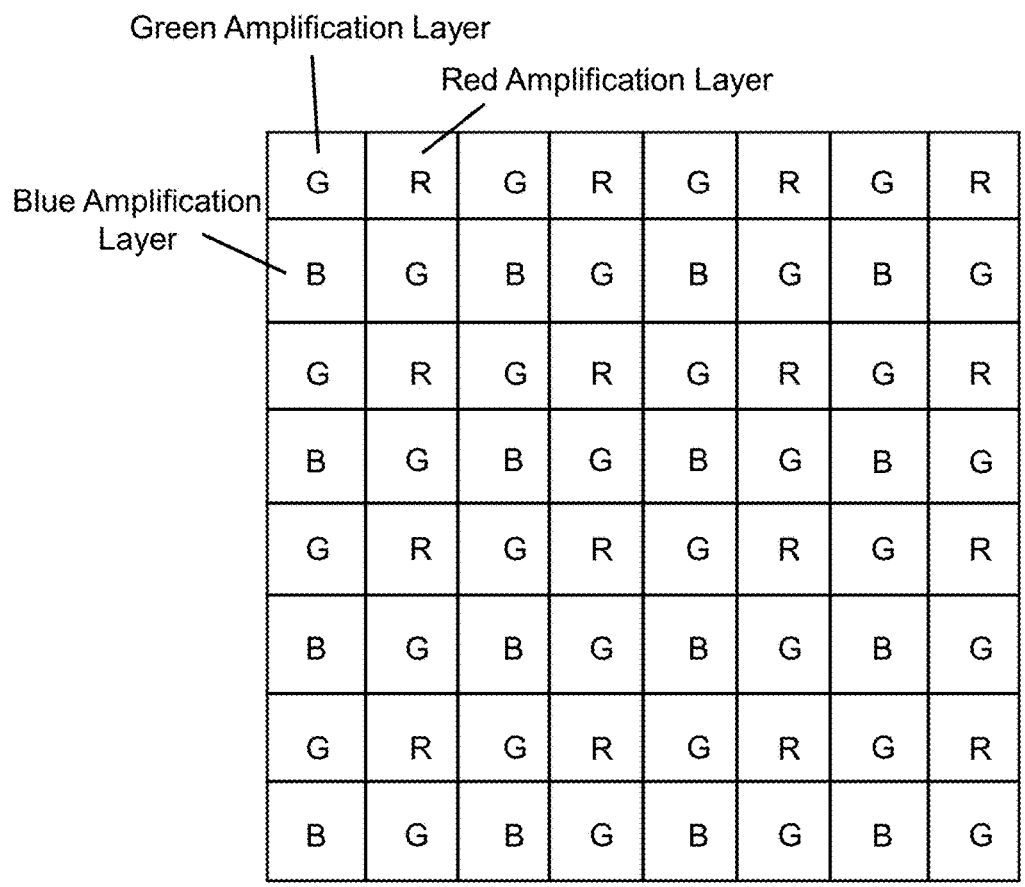
FIGS. 6A to 6C are schematic diagrams of another exemplary optical amplifier according to some embodiments of the present disclosure.
Figure 6B:
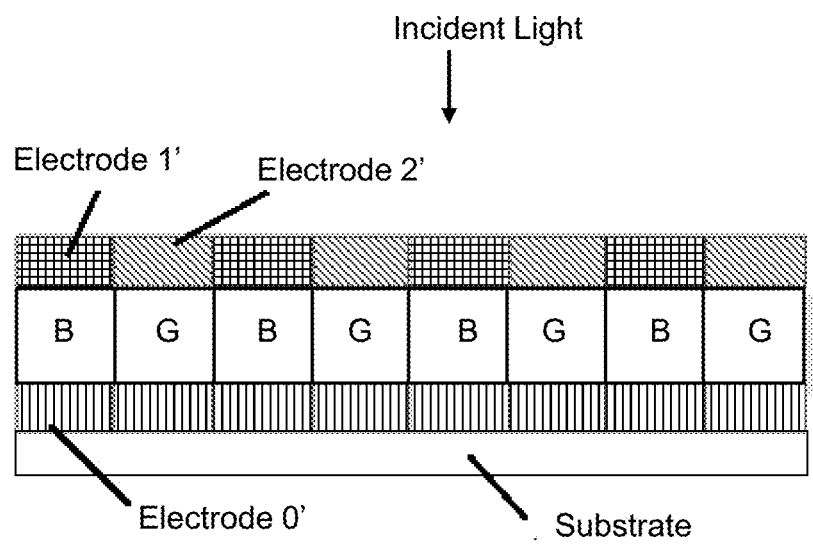
Figure 6C:
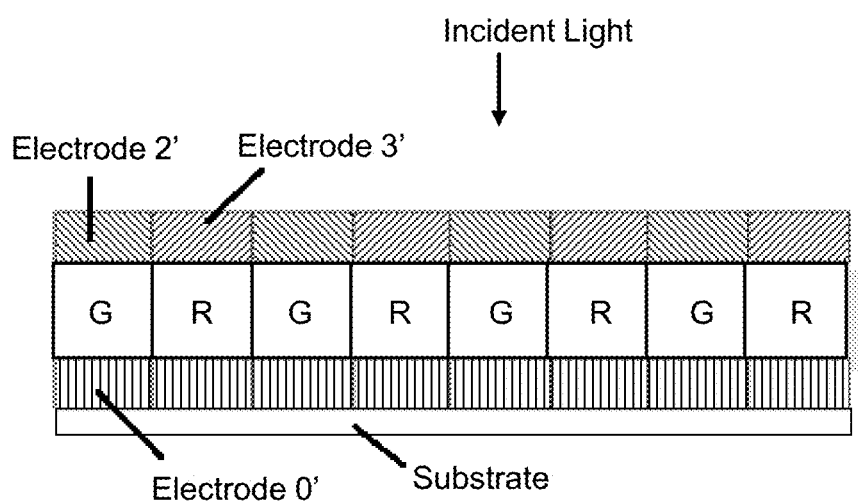

FIGS. 6A to 6C are schematic diagrams of another exemplary optical amplifier according to some embodiments of the present disclosure. FIG. 6A shows a top view of the optical amplifier. In some embodiments, a red amplification layer (also referred to as red amplification element), a green amplification layer (also referred to as green amplification element), and a blue amplification layer (also referred to as blue amplification element) may be formed on a substrate and be arranged in a Bayer pattern. In some embodiments, the semiconductor materials used in the red amplification layer, in the green amplification layer and/or in the blue amplification layer of the optical amplifier herein may be similar to that of the optical amplifier as illustrated in connection with FIG. 5, and the descriptions thereof are not repeated. The three optical amplification layers (or elements) in the Bayer pattern may match with the photosensitive elements of the image sensor that are also arranged in the Bayer pattern. Specifically, the three optical amplification layers (or elements) may be arranged according to the arrangement of the photosensitive elements of the image sensor. For example, for a location of the image sensor, if the location is installed with a photosensitive element corresponding to red light, a red light amplification layer may be arranged at the corresponding location of the optical amplifier. In the Bayer pattern, the number of the green amplification layers may be the double of the number of the red amplification layer or the number of the blue amplification layers. In some embodiments, in a row or a column, the green amplification layer(s) and one of the red amplication layer(s) and the blue amplfication layer(s) may be interleavedly arranged. For example, the green amplification layer(s) and the red amplification layer(s) may be interleavedly arranged at a first row. As another example, the green amplification layer(s) and the blue amplification layer(s) may be interleavedly arranged at a second row.

Merely by way of example, as shown in FIG. 6A, at the first row, the green amplification layer (also referred to as green amplification element, represented by "G"), the red amplification layer (also referred to as red amplification element, represented by "R"), the green amplification layer (G), the red amplification layer (R), the green amplification layer (G), the red amplification layer (R), the green amplification layer (G) and the red amplification layer (R) may be arranged from left to right. At the second row, the blue amplification layer (also referred to as blue amplification element, represented by "B"), the green amplification layer (G), the blue amplification layer (B), the green amplification layer (G), the blue amplification layer (B), the green amplification layer (G), the blue amplification layer (B) and the green amplification layer (G) may be arranged from left to right. The arrangement of the optical amplification layers in other rows may be the same as that of the first row or the second row, and the descriptions thereof are not repeated herein.

FIG. 6B is a schematic diagram illustrating a cross-section of the optical amplifier shown in FIG. 6A. The optical amplifier may include at least one electrode layer. Specifically, electrode 0' may be disposed over the substrate. Electrode 1' may be disposed over the blue amplification layer (B). Electrode 2' may be disposed over the green amplification layer (G). The upper side and lower side of each optical amplification layer may be electrically connected with two electrodes, respectively. For example, electrode 1' may be on the upper side of the blue amplification layer, and electrode 0' may be on the lower side of the blue amplification layer. Electrode 2' may be on the upper side of the green amplification layer, and electrode 0' may be on the lower side of the green amplification layer.

FIG. 6C is a schematic diagram illustrating another cross-section of the optical amplifier shown in FIG. 6A. The optical amplifier may include at least one electrode layer. Specifically, electrode 0' may be disposed over the substrate. Electrode 2' may be disposed over the green amplification layer (G). Electrode 3' may be disposed over the red amplification layer (R). The upper side and lower sides of each optical amplification layer may be electrically connected with two electrodes, respectively. For example, electrode 2' may be on the upper side of the green amplification layer, and electrode 0' may be on the lower side of the green amplification layer. Electrode 3' may be on the upper side of the red amplification layer, and electrode 0' may be on the lower side of the red amplification layer.

In some embodiments, incident light may enter into the optical amplifier as indicated by the arrow illustrated in FIGS. 6B and 6C. When the incident light passes through the blue amplification layer(s), only blue light in the incident light may be amplified. When the incident light passes through the green amplification layer(s), only green light in the incident light may be amplified. When the incident light passes through the red amplification layer(s), only red light in the incident light may be amplified.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. Apparently, the optical amplifier that includes the red amplification layer (or red amplification element), the green amplification layer (or green amplification element) and the blue amplification layer (or the blue amplification element) is merely an embodiment of the present disclosure, and the optical amplifier may include any other optical amplification layer. In some embodiments, the optical amplification layers may be arranged in any other pattern, such as a mash pattern, a stripped pattern, or the like.

Figure 7A:
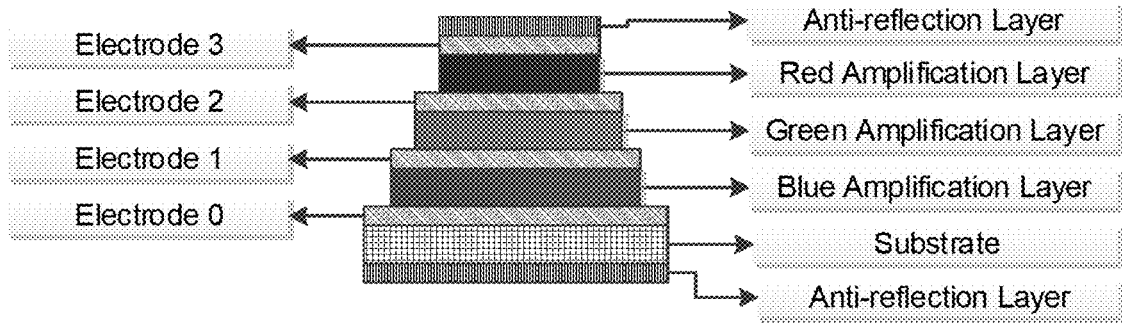
FIGS. 7A to 7C are schematic diagrams of three exemplary optical amplifiers according to some embodiments of the present disclosure.

In some embodiments, the optical amplifier may include an anti-reflection layer formed on a first end face of the optical amplifier on which light is incident, and/or an anti-reflection layer formed on a second end face of the optical amplifier from which the light is output. For example, FIG. 7A is a schematic diagram of an exemplary optical amplifier according to some embodiments of the present disclosure. As shown in FIG. 7A, the optical amplifier may include three optical amplification layers (e.g., a red amplification layer, a green amplification layer, and a blue amplification layer), a substrate, a plurality of electrode layers (e.g., electrode 0, electrode 1, electrode 2, and electrode 3), and two anti-reflection layers. Details regarding the three optical amplification layers, the substrate, the plurality of electrode layers (e.g., electrode 0, electrode 1, electrode 2, and electrode 3) may be found elsewhere in the present disclosure (e.g., FIG. 5 and the descriptions thereof). The two anti-reflection layers may be disposed on a first end face of the optical amplifier on which the light is incident (also referred to as light-incident side) and a second end face of the optical amplifier from which the light is output (also referred to as light-emitting side). The anti-reflection layers formed on the light-incident side and/or the light-emitting side of the optical amplifier may increase the transmittance of visible light. For example, for light with the wavelength of 550 nm, the refractive index in the substrate (e.g., sapphire) and GaN may be 1.77 and 2.41, respectively. The reflectivity at an interface between the substrate (e.g., sapphire) and air and/or an interface between GaN and air may be 7.7% and 17.1%, respectively. If the anti-reflection layers are not used, the reflection may be severe, and a tolerance of the optical amplifier in lasing and non-lasing states may be small, which may result in poor manufacturability. In some embodiments, the optical amplifier having one or more anti-reflection layers disposed on its end face(s) may also be referred to as a transmission-mode optical amplifier.

Figure 7B:
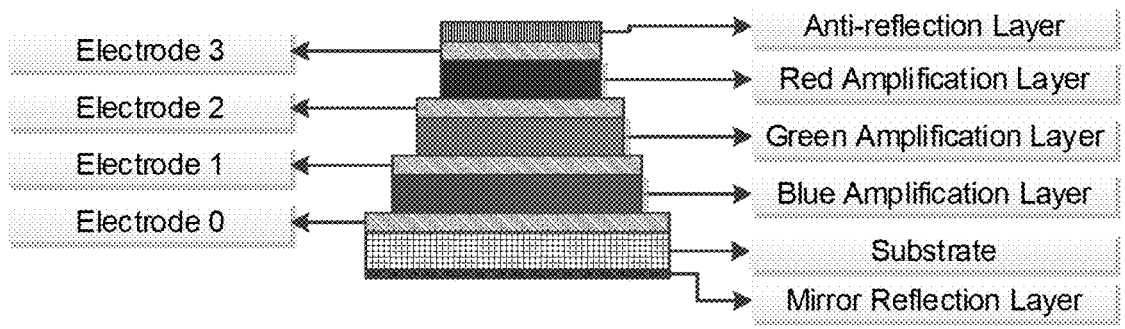

In some embodiments, the optical amplifier may include a mirror reflection layer formed on an end face of the optical amplifier. In some embodiments, the mirror reflection layer may be formed on the end face of the optical amplifier from which the light is output (e.g., light-emitting side). For example, FIG. 7B is a schematic diagram of an exemplary optical amplifier according to some embodiments of the present disclosure. As shown in FIG. 7B, the optical amplifier may include three optical amplification layers (e.g., a red amplification layer, a green amplification layer, and a blue amplification layer), a substrate, a plurality of electrode layers (e.g., electrode 0, electrode 1, electrode 2, and electrode 3), an anti-reflection layer, and a mirror reflection layer. Details regarding the three optical amplification layers, the substrate, the plurality of electrode layers (e.g., electrode 0, electrode 1, electrode 2, and electrode 3) may be found elsewhere in the present disclosure (e.g., FIG. 5 and the descriptions thereof). The anti-reflection layer may be disposed on the light-incident side and the mirror reflection layer may be disposed on the light-emitting side. The mirror reflection layer formed on the light-emitting side of the optical amplifier may increase the gain of light impinging on the optical amplifier. Specifically, incident light may enter into the optical amplifier, and at least portion of the incident light may be amplified by the optical amplification layers. When the (amplified) incident light reaches the mirror reflection layer, the (amplified) incident light may be reflected by the mirror reflection layer. Thus, the mirror reflection layer may cause incident light to pass through the optical amplification layers twice, which may double the gain of the incident light. In some embodiments, the optical amplifier having one or more anti-reflection layers and a mirror reflection layer disposed on its end face(s) may also be referred to as a reflection-mode optical amplifier.

Figure 7C:
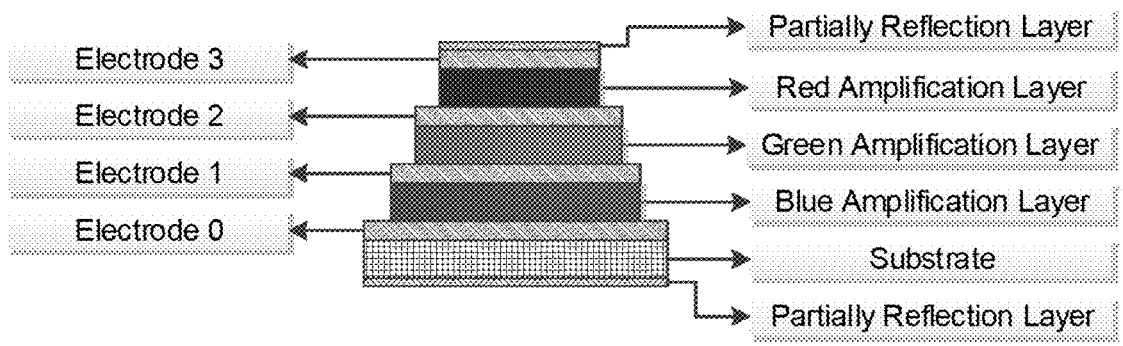

In some embodiments, the optical amplifier may include a partially reflection layer formed on a first end face of the optical amplifier on which light is incident (e.g., light-incident side), and/or a partially reflection layer formed on a second end face of the optical amplifier from which light is output (e.g., light-emitting side). For example, FIG. 7C is a schematic diagram of an exemplary optical amplifier according to some embodiments of the present disclosure. As shown in FIG. 7C, the optical amplifier may include three optical amplification layers (e.g., a red amplification layer, a green amplification layer, and a blue amplification layer), a substrate, a plurality of electrode layers (e.g., electrode 0, electrode 1, electrode 2, and electrode 3), and two partially reflection layers. Details regarding the three optical amplification layers, the substrate, the plurality of electrode layer (e.g., electrode 0, electrode 1, electrode 2, and electrode 3) may be found elsewhere in the present disclosure (e.g., FIG. 5 and the descriptions thereof). The two partially reflection layers may be disposed on the light-incident side and the light-emitting side. The partially reflection layers formed on the light-incident side and/or the light-emitting side of the optical amplifier may increase the gain of light impinging on the optical amplifier. Specifically, when incident light impinges on the partially reflection layer(s), due to the amplification of the incident light and/or energy loss of the incident light in the optical amplifier, a portion of the incident light may be reflected and a portion of the incident light may be transmitted. It should be noted that the reflected portion of the incident light and/or the transmitted portion of the incident light may not be affected by the wavelength ranges. Light within any wavelength range may be reflected or transmitted. In some embodiments, when a phase difference between two lights with a same wavelength, at a same location and in a same direction is an integer multiple of $2\pi$, the wavelength of the lights may be referred to as a coherent phase wavelength. The coherent phase wavelength $\lambda$ of light may depend on the effective refractive index of light in the optical amplifier $n_{\mathit{eff}}$ and the length of light oscillating L (e.g., $\lambda=2\times n_{\mathit{eff}}\times L/m$, wherein m is a positive integer). Light with the coherent phase wavelength may oscillate back and forth in the optical amplifier and may be amplified a plurality of times. In some embodiments, the optical amplifier having one or more partially reflection layers disposed on its end face(s) may also be referred to as a resonance-mode optical amplifier.

In the present disclosure, the anti-reflection layer(s), and/or the mirror reflection layer(s), and/or the partially reflection layer(s) formed on the light-incident side and/or the light-emitting side of the optical amplifier may increase the gains of light, and further improve imaging quality.

It should be noted that the above description is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. In some embodiments, the light-incident side of the optical amplifier may be only disposed with the anti-reflection layer(s), or only disposed with the partially reflection layer(s), or disposed with the anti-reflection layer(s) and the partially reflection layer(s). In some embodiments, the light-emitting side of the optical amplifier may be only disposed with the anti-reflection layer(s), or only disposed with the mirror reflection layer(s), or only disposed with the partially reflection layer(s), or disposed with any two of the anti-reflection layer(s), the mirror reflection layer(s) and the partially reflection layer(s), or disposed with the anti-reflection layer(s), the mirror reflection layer(s) and the partially reflection layer(s). In some embodiments, the optical amplifier shown in FIG. 6A may be disposed with the anti-reflection layer(s), the mirror reflection layer(s), and/or the partially reflection layer(s).

The present disclosure also provides an image capturing device. The image capturing device may enable color imaging in low light, even ultra-low light. In some embodiments, the image capturing device may be a camera, a smartphone, a tablet, a camcorder, or the like, or any combination thereof. The image capturing device may include an imaging optics, at least one optical amplifier and an image sensor. In some embodiments, the imaging optics may be configured to focus light onto the image sensor. The imaging optics may include a set of lenses, etc. The at least one optical amplifier may be configured to amplify the light impinging on the at least one optical amplifier. In some embodiments, the optical amplifier may include a semiconductor optical amplifier, a Raman optical amplifier, an Erbium doped fiber amplifier (EDFA), or the like. In the present disclosure, the optical amplifier may be a semiconductor optical amplifier. Specifically, the optical amplifier may be the optical amplifier(s) described in the present disclosure (e.g., the optical amplifier as illustrated in FIG. 5, the optical amplifier as illustrated in FIGS. 6A to 6C, the transmission-mode optical amplifier as illustrated in FIG. 7A, the reflection-mode optical amplifier as illustrated in FIG. 7B, or the resonance-mode optical amplifier as illustrated in FIG. 7C). In some embodiments, the optical amplifier may include one or more optical amplification layers (e.g., a red amplification layer, a green amplification layer, a blue amplification layer). Light impinging on the optical amplifier may be amplified by the one or more optical amplification layers. For example, red light in the light may be amplified by the red amplification layer, green light in the light may be amplified by the green amplification layer, and blue light in the light may be amplified by the blue amplification layer. The amplified light may be received and/or detected by the image sensor. In some embodiments, the image sensor may include CCD, CMOS, or the like, or any combination thereof.

In some embodiments, the imaging optics, the at least one optical amplifier and the image sensor may be disposed along an optical path so as to amplify the incident light and implement the imaging on the image sensor. In some embodiments, the imaging optics may be arranged before the at least one optical amplifier. Alternatively, the at least one optical amplifier may be arranged before the imaging optics. It should be noted that the imaging optics and the at least one optical amplifier may both be arranged before the image sensor. In order to improve the imaging quality, a center of each of the at least one optical amplifier may be aligned with a center of the image sensor. In some embodiments, the wavelength corresponding to the largest gain in each optical amplification layer may align with a center wavelength of the corresponding photosensitive element of the image sensor. In some embodiments, if the optical amplification layers are arranged in a Bayer pattern, the optical amplification layers should match photosensitive elements of the image sensor. For example, an array of the optical amplification layers may be aligned with an array of the photosensitive elements of the image sensor. Specifically, the red amplification layers (or elements) may be aligned with the photosensitive elements corresponding to red light, the green amplification layers (or elements) may be aligned with the photosensitive elements corresponding to green light, and the blue amplification layers (or elements) may be aligned with the photosensitive elements corresponding to blue light. In some embodiments, when setting the relative positions of the at least one optical amplifier and the image sensor, it is desired to ensure that the amplified light by the at least one optical amplifier can impinge onto the image sensor. Thus, in some embodiments, a plane of the at least one optical amplifier may be parallel to a plane of the image sensor, both of which are perpendicular to an incident direction of the incident light (see FIGS. 8A to 9D). In some embodiments, a plane of the at least one optical amplifier and a plane of the image sensor may form an angle, both of which are perpendicular to a direction of an optical path (e.g., optical path indicated by the arrows illustrated in FIGS. 10A and 10B). For example, the angle between the plane of the at least one optical amplifier and the plane of the image sensor may be 45° (see FIGS. 10A to 11).

Figure 8A:
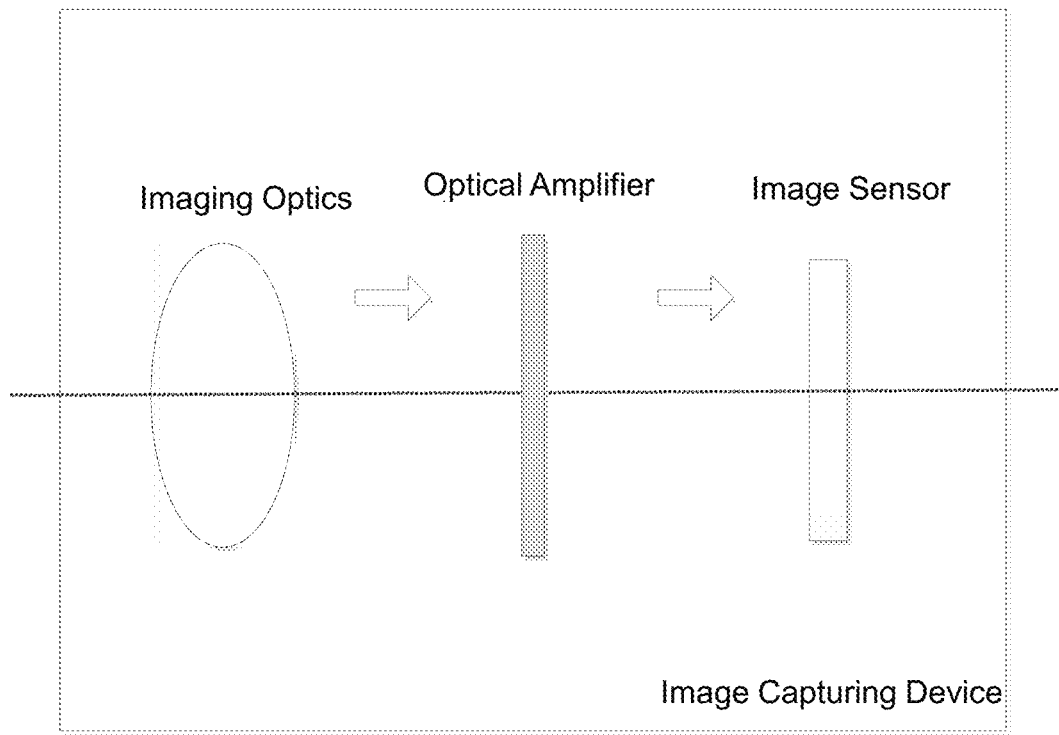
FIGS. 8A and 8B are schematic diagrams of exemplary image capturing devices according to some embodiments of the present disclosure.
Figure 8B:
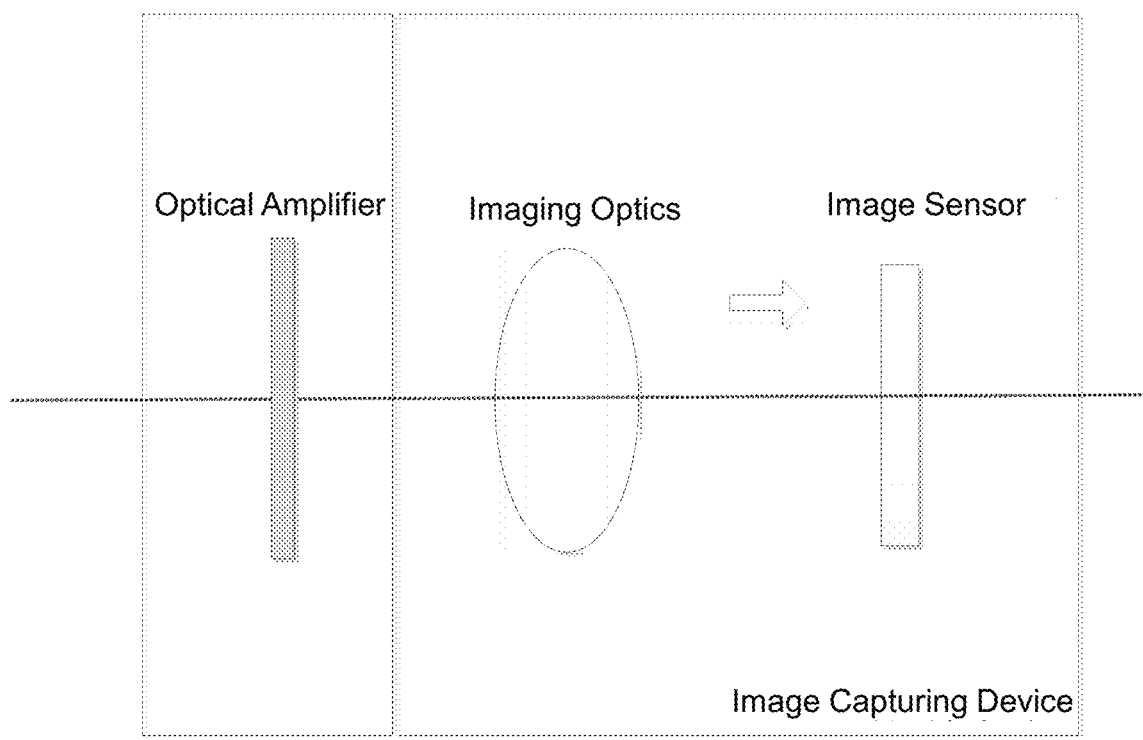

FIGS. 8A and 8B are schematic diagrams of exemplary image capturing devices according to some embodiments of the present disclosure. The image capturing device may include an imaging optics, an optical amplifier, and an image sensor. In some embodiments, the optical amplifier may be an optical amplifier illustrated in FIG. 5, the optical amplifier illustrated in FIG. 6A to 6C, or the like. As shown in FIGS. 8A and 8B, the direction indicated by the arrows may represent an optical path. The imaging optics, the optical amplifier and the image sensor may be arranged along the optical path. The plane of the optical amplifier may be parallel to the plane of the image sensor. The center of the imaging optics, the center of the optical amplifier, and the center of the image sensor may be aligned. As shown in FIG. 8A, the imaging optics may be disposed before the optical amplifier. Incident light may be focused or converged by the imaging optics. Then the focused or converged light may be amplified by the optical amplifier. The amplified light may be detected and/or imaged by the image sensor. As shown in FIG. 8B, the optical amplifier may be disposed before the imaging optics. Incident light may be amplified by the optical amplifier. The amplified light may be focused or converged by the imaging optics. Then the focused or converged light may be detected and/or imaged by the image sensor. It should be noted that the imaging optics and the optical amplifier may be arranged arbitrarily as long as they are both located before the imaging sensor.

Figure 9A:
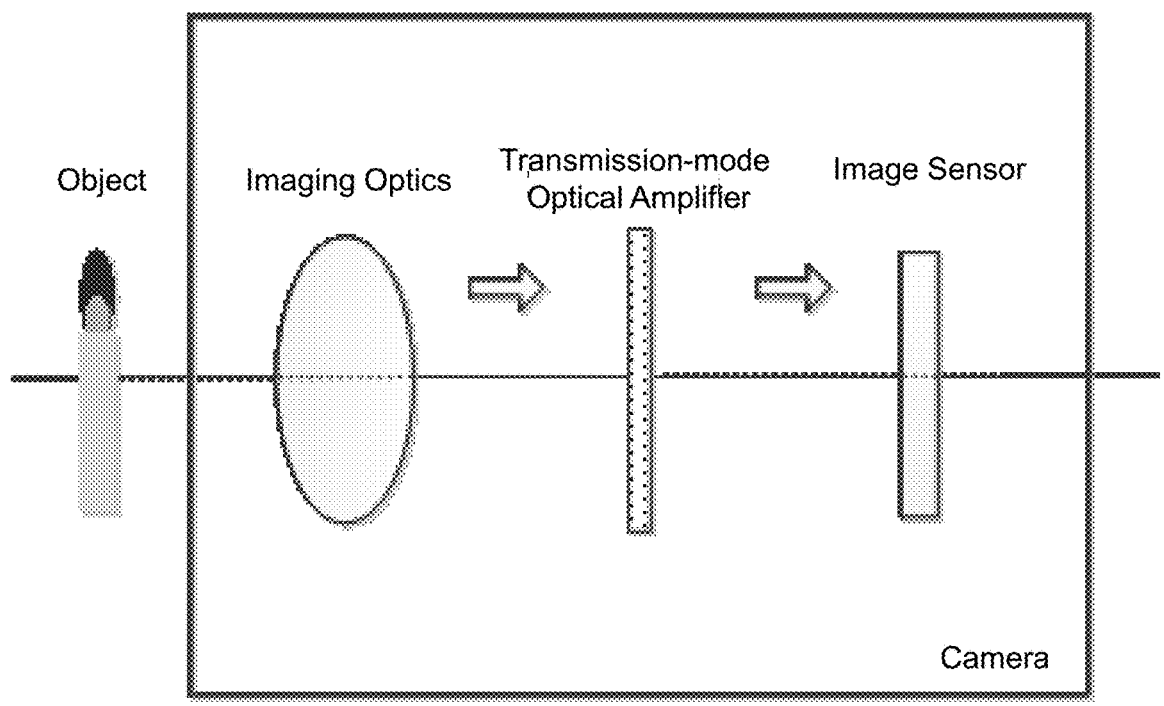
FIGS. 9A to 9D are schematic diagrams of exemplary image capturing devices according to some embodiments of the present disclosure.
Figure 9B:
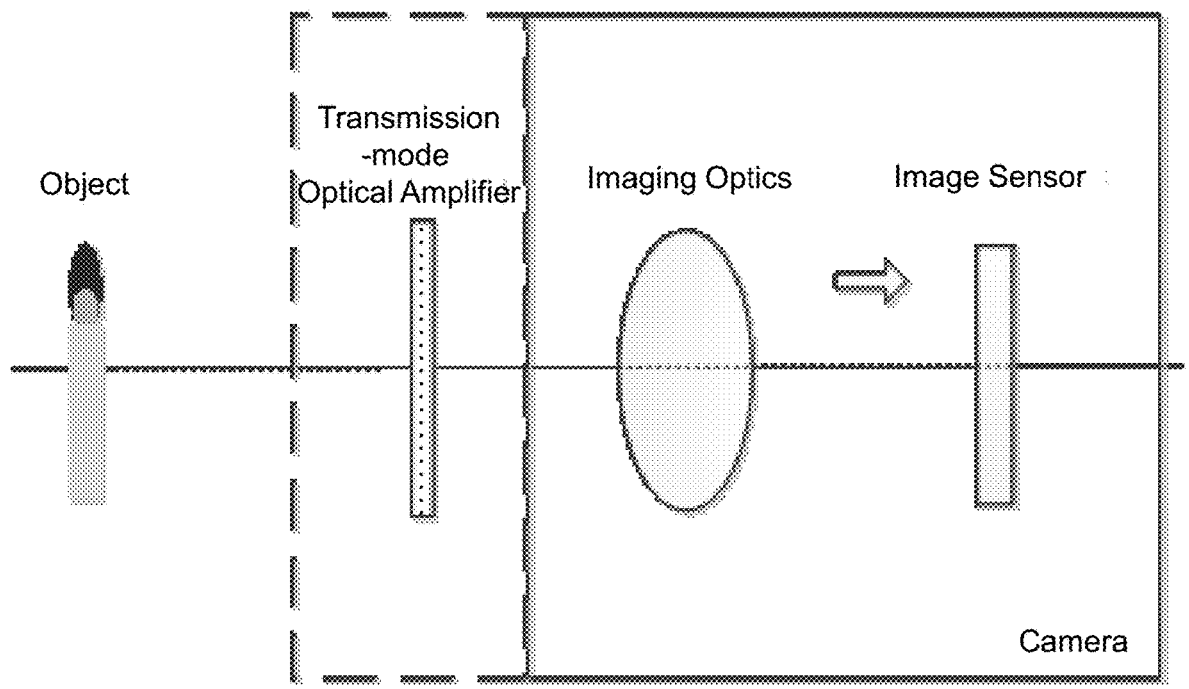

FIGS. 9A and 9B are schematic diagrams of exemplary image capturing devices according to some embodiments of the present disclosure. The image capturing device may be a camera. The camera may include an imaging optics, a transmission-mode optical amplifier, and an image sensor. The transmission-mode optical amplifier may be a transmission-mode optical amplifier illustrated in FIG. 7A. As shown in FIGS. 9A and 9B, the direction indicated by the arrows may represent an optical path. The imaging optics, the transmission-mode optical amplifier and the image sensor may be arranged along the optical path. The plane of the transmission-mode optical amplifier may be parallel to the plane of the image sensor. The center of the imaging optics, the center of the transmission-mode optical amplifier, and the center of the image sensor may be aligned. As shown in FIG. 9A, the imaging optics may be disposed before the transmission-mode optical amplifier. Light from an object may be described as the incident light. The incident light may be focused or converged by the imaging optics. Then the focused or converged light may be amplified by the transmission-mode optical amplifier. The amplified light may be detected and/or imaged by the image sensor. As shown in FIG. 9B, the transmission-mode optical amplifier may be disposed before the imaging optics. Light from an object may be described as the incident light. The incident light may be amplified by the transmission-mode optical amplifier. The amplified light may be focused or converged by the imaging optics. Then the focused or converged light may be detected and/or imaged by the image sensor. It should be noted that the imaging optics and the transmission-mode optical amplifier may be arranged arbitrarily as long as they are both located before the imaging sensor.

Figure 9C:
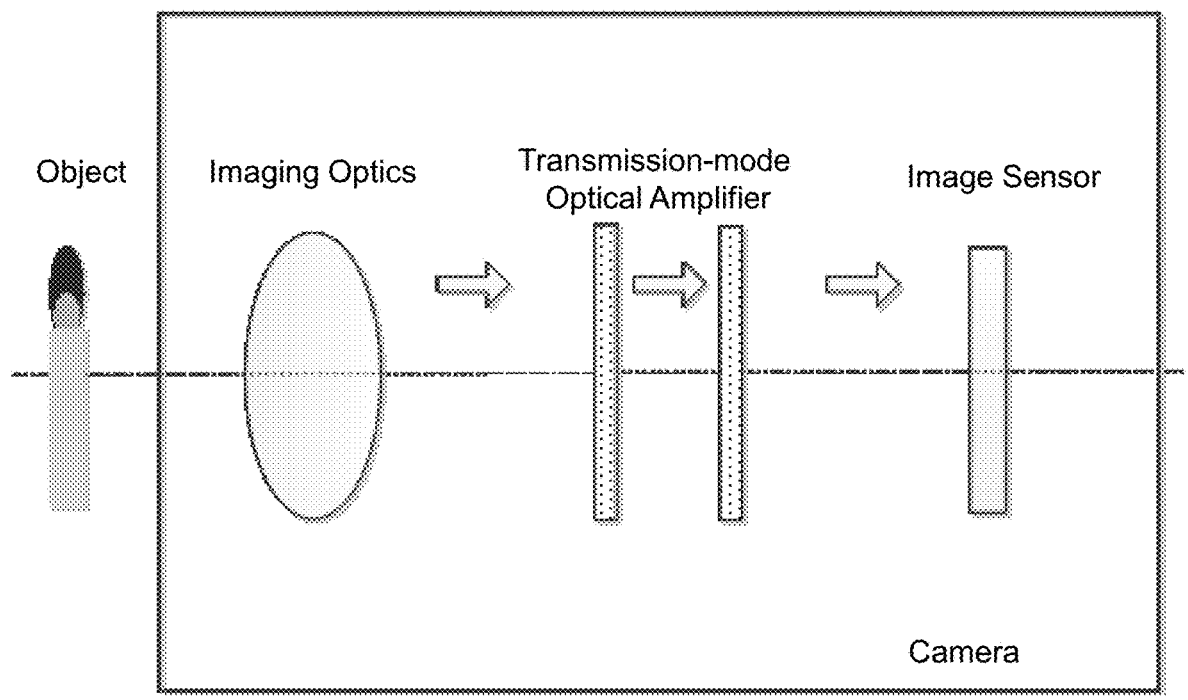
Figure 9D:
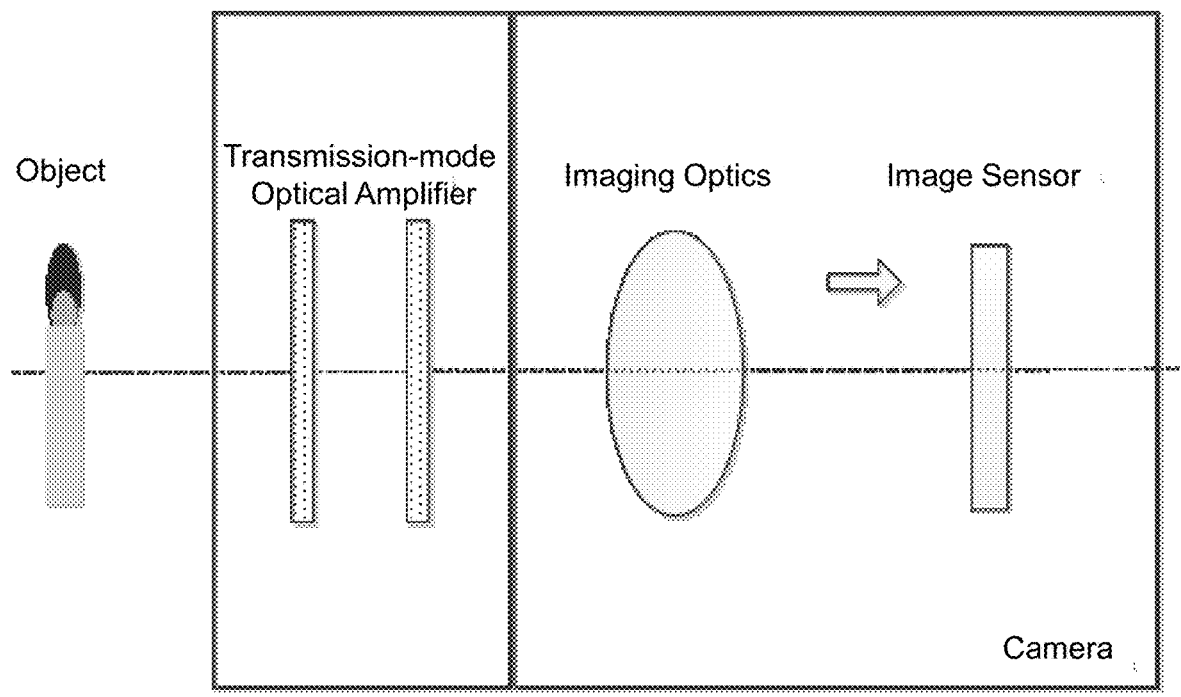

FIGS. 9C and 9D are schematic diagrams of exemplary image capturing devices according to some embodiments of the present disclosure. The image capturing device may be a camera. The camera may include an imaging optics, two transmission-mode optical amplifiers, and an image sensor. The transmission-mode optical amplifiers may be transmission-mode optical amplifiers illustrated in FIG. 7A. As shown in FIGS. 9C and 9D, the direction indicated by the arrows may represent an optical path. The imaging optics, the transmission-mode optical amplifiers and the image sensor may be arranged along the optical path. The plane of the transmission-mode optical amplifiers may be parallel to the plane of the image sensor. The center of the imaging optics, the center of each of the transmission-mode optical amplifiers, and the center of the image sensor may be aligned. As shown in FIG. 9C, the imaging optics may be disposed before the transmission-mode optical amplifiers. Light from an object may be described as the incident light. The incident light may be focused or converged by the imaging optics. Then the focused or converged light may be amplified by the two transmission-mode optical amplifiers. The amplified light may be detected and/or imaged by the image sensor. As shown in FIG. 9D, the transmission-mode optical amplifiers may be disposed before the imaging optics. Light from an object may be described as the incident light. The incident light may be amplified by the two transmission-mode optical amplifiers. The amplified light may be focused or converged by the imaging optics. Then the focused or converged light may be detected and/or imaged by the image sensor. It should be noted that the imaging optics and the two transmission-mode optical amplifiers may be arranged arbitrarily as long as they are both located before the imaging sensor. For example, a transmission-mode optical amplifier, the imaging optics, a transmission-mode optical amplifier, the image sensor may be disposed orderly along the optical path. Compared with the camera in FIGS. 9A and 9B, the incident light may be amplified twice by the two transmission-mode optical amplifiers, which may double the gain of the incident light. In some embodiments, the camera may include a plurality of transmission-mode optical amplifiers, and the light passes through the plurality of transmission-mode optical amplifiers may be amplified a plurality of times.

Figure 10A:
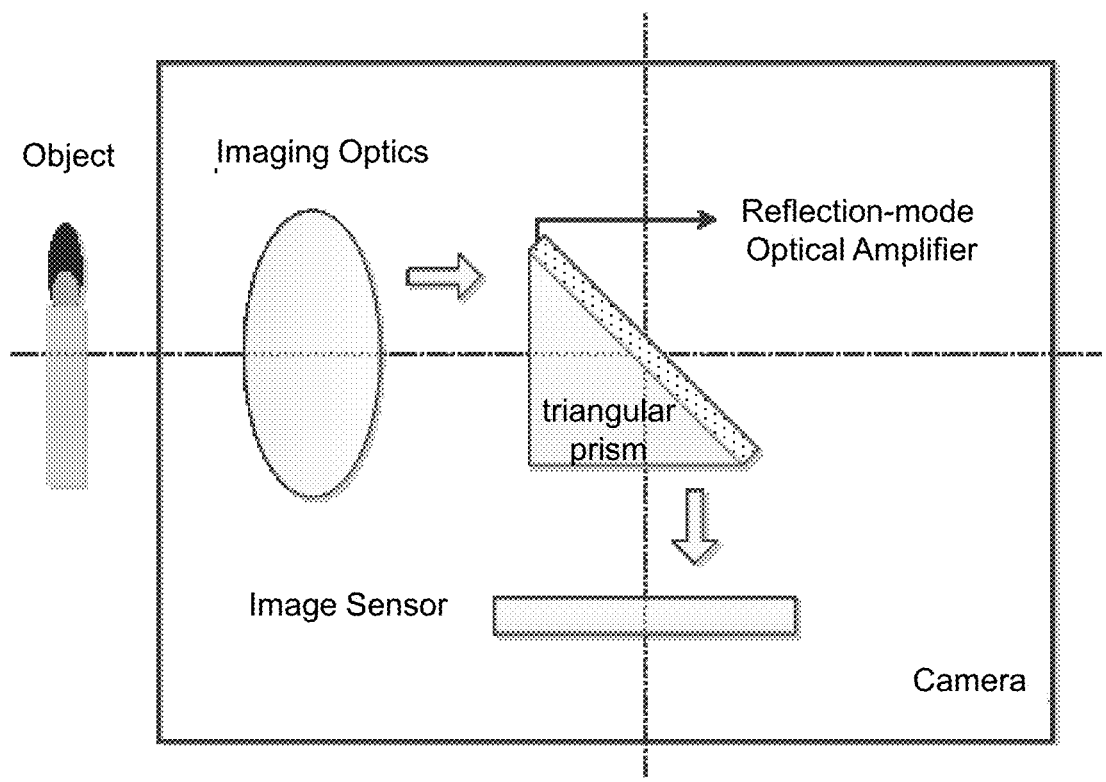
FIGS. 10A and 10B are schematic diagrams of exemplary image capturing devices according to some embodiments of the present disclosure.

FIG. 10A is a schematic diagram of an exemplary image capturing device according to some embodiments of the present disclosure. The image capturing device may be a camera. The camera may include an imaging optics, a triangular prism, a reflection-mode optical amplifier, and an image sensor. The reflection-mode optical amplifier may be a reflection-mode optical amplifier illustrated in FIG. 7B. The reflection-mode optical amplifier may be disposed over a long side of the triangular prism. The direction indicated by the arrows may represent an optical path. The imaging optics, the reflection-mode optical amplifier and the image sensor may be arranged along the optical path. The angle between the plane of the reflection-mode optical amplifier and the plane of the image sensor may be 45°. The center of the imaging optics, the center of the reflection-mode optical amplifier, and the center of the image sensor may be aligned. Light from an object may be described as the incident light. The incident light may be focused or converged by the imaging optics. The focused or converged light may be injected into the triangular prism and may be amplified by one or more optical amplification layers of the reflection-mode optical amplifier. Then the amplified light may be reflected by a mirror reflection layer of the reflection-mode optical amplifier. The reflected light may travel back to the one or more optical amplification layers, thus being amplified by the reflection-mode optical amplifier again. The amplified light may be detected and/or imaged by the image sensor. Since the incident light passes through the reflection-mode optical amplifier twice, the incident light may be amplified twice.

Figure 10B:
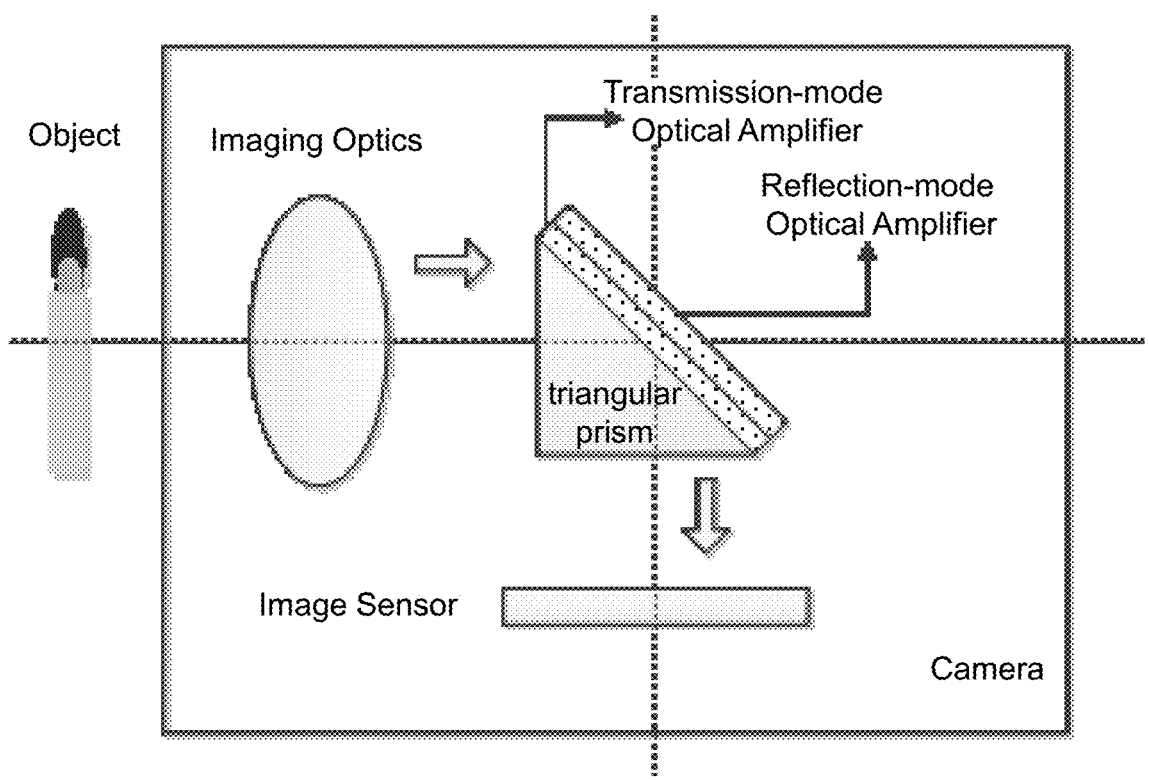

FIG. 10B is a schematic diagram of an exemplary image capturing device according to some embodiments of the present disclosure. The image capturing device may be a camera. The camera may include an imaging optics, a triangular prism, a transmission-mode optical amplifier, a reflection-mode optical amplifier, and an image sensor. The transmission-mode optical amplifier may be a transmission-mode optical amplifier illustrated in FIG. 8A. The reflection-mode optical amplifier may be a reflection-mode optical amplifier illustrated in FIG. 7B. The transmission-mode optical amplifier and/or the reflection-mode optical amplifier may be disposed over a long side of the triangular prism. The direction indicated by the arrows may represent an optical path. The imaging optics, the transmission-mode optical amplifier, the reflection-mode optical amplifier and the image sensor may be arranged along the optical path. The angle between the plane(s) of the transmission-mode optical amplifier and/or the reflection-mode optical amplifier and the plane of the image sensor may be 45°. The center of the imaging optics, the center of the transmission-mode optical amplifier and/or the reflection-mode optical amplifier, and the center of the image sensor may be aligned. Light from an object may be described as the incident light. The incident light may be focused or converged by the imaging optics. The focused or converged light may be injected into the triangular prism and may be amplified by the transmission-mode optical amplifier and the reflection-mode optical amplifier. Then the amplified light may be reflected by a mirror reflection layer of the reflection-mode optical amplifier. The reflected light may travel back to the one or more optical amplification layers, thus being amplified by the reflection-mode optical amplifier and the transmission-mode optical amplifier again. The amplified light may be detected and/or imaged by the image sensor. Since the incident light passes through the transmission-mode optical amplifier and the reflection-mode optical amplifier twice, respectively, the incident light may be amplified fourth. In some embodiments, the camera may include a plurality of transmission-mode optical amplifiers and a reflection-mode optical amplifier, and the incident light passes through the plurality of transmission-mode optical amplifiers and the reflection-mode optical amplifier may be amplified a plurality of times.

Figure 11:
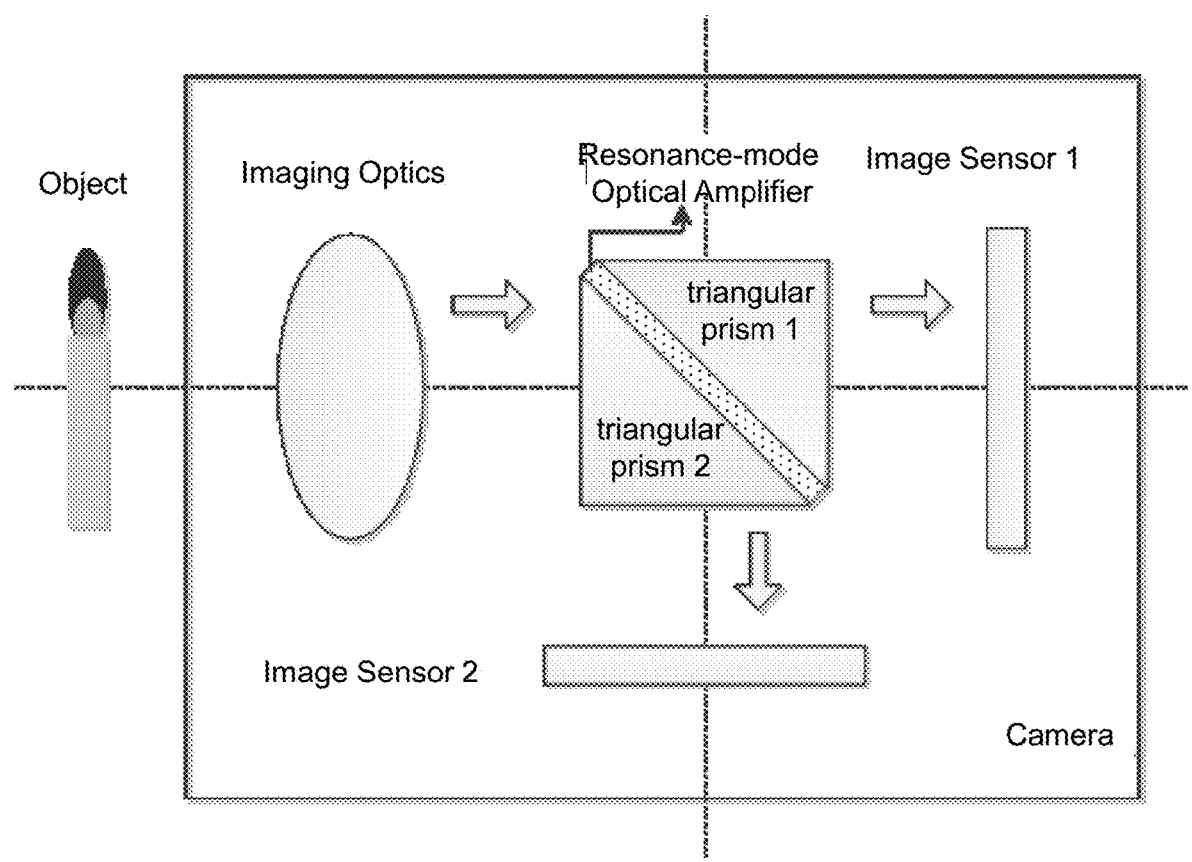
FIG. 11 is a schematic diagram of an exemplary image capturing device according to some embodiments of the present disclosure.
Figure 12A:
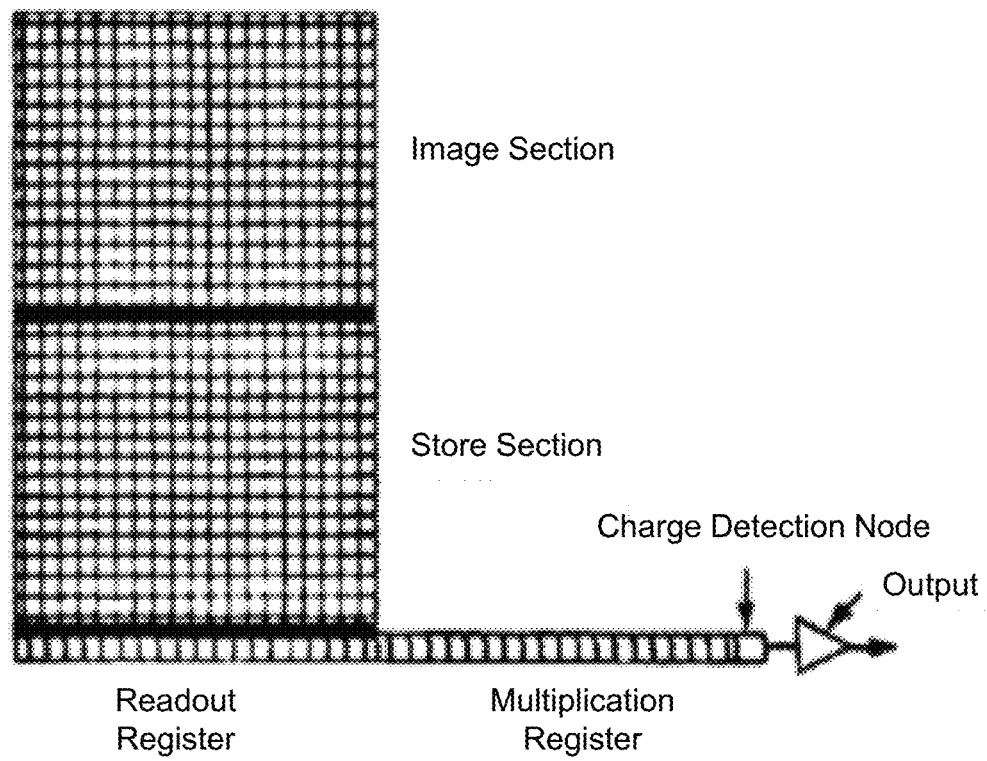
FIG. 12A is a schematic diagram of an EMCCD.
Figure 12B:
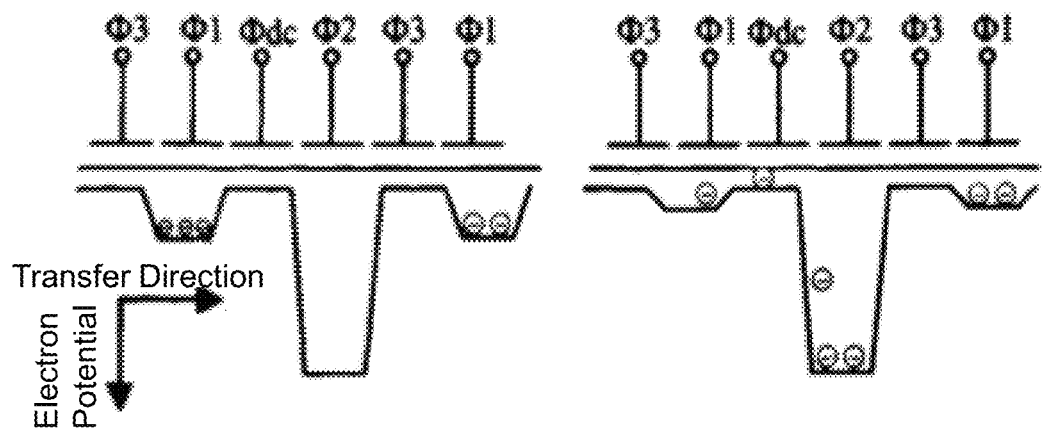
FIG. 12B is a schematic diagram illustrating a process of charge transfer in the multiplication register.
Figure 12C:
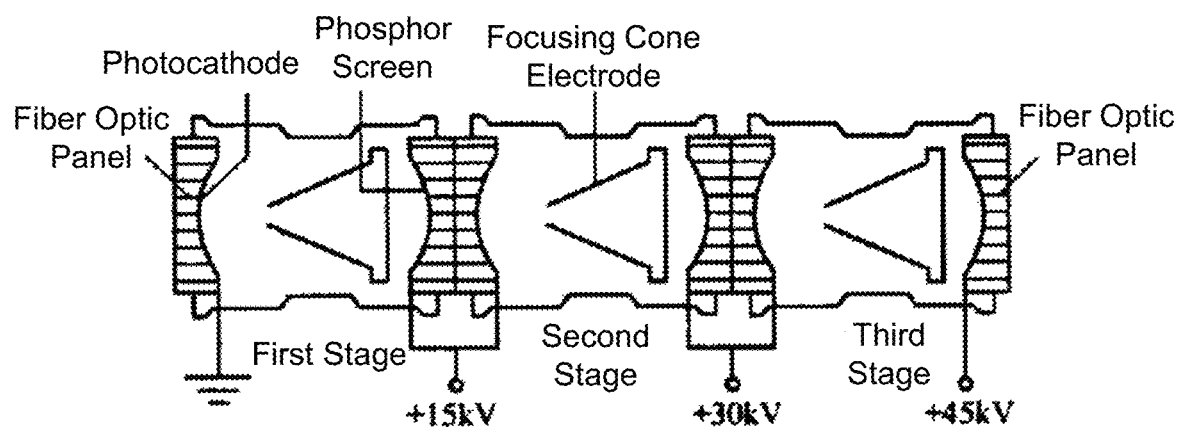
FIG. 12C is a schematic diagram of a low-light level night vision.

FIG. 11 is a schematic diagram of an exemplary image capturing device according to some embodiments of the present disclosure. The image capturing device may be a camera. The camera may include an imaging optics, two triangular prisms (triangular prism 1, triangular prism 2), a resonance-mode optical amplifier, and two image sensors (e.g., image sensor 1, image sensor 2). The resonance-mode optical amplifier may be a resonance-mode optical amplifier illustrated in FIG. 7C. The resonance-mode optical amplifier may be disposed between the two triangular prisms to form a square prism. The direction indicated by the arrows may represent an optical path. The imaging optics, the resonance-mode optical amplifier and the image sensors (the image sensor 1, the image sensor 2) may be arranged along the optical path. The angle between the plane of the resonance-mode optical amplifier and the plane of the image sensors (the image sensor 1, the image sensor 2) may be 45°. The center of the imaging optics, the center of the resonance-mode optical amplifier, and the center of the image sensors may be aligned. Light from an object may be described as incident light. The incident light may be focused or converged by the imaging optics. The focused or converged light may be injected into the square prism and may be amplified by the resonance-mode optical amplifier. When entering the resonance-mode optical amplifier, partial light may be reflected and partial light may be transmitted by the resonance-mode optical amplifier. The reflected light may travel back to the one or more optical amplification layers, thus being amplified by the resonance-mode optical amplifier again. The amplified light may be detected by the image sensor2. The transmitted light may be detected by the image sensor1. In some embodiments, due to the resonance, light with coherent phase wavelength(s) may be amplified multiple times by the resonance-mode optical amplifier.

It should be noted that the above descriptions of the image capturing devices are provided for the purposes of illustration, and is not intended to limit the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

What is claimed is:

1. An optical amplifier configured for an image capturing device, comprising:
   a substrate;
   an optical amplification region formed over the substrate,
      the optical amplification region including a first optical amplification layer and a second optical amplification layer, wherein the first optical amplification layer is configured to amplify light at a first wavelength range, and the second optical amplification layer is configured to amplify light at a second wavelength range; and at least one electrode layer electrically contacting the optical amplification region, wherein the at least one electrode layer has a porous structure, and at least one of the optical amplification layers is formed over and contacts the substrate through the porous structure of the at least one electrode layer.

2. The optical amplifier of claim 1, wherein the optical amplification region further includes a third optical amplification layer, the third optical amplification layer being configured to amplify light at a third wavelength range.

3. The optical amplifier of claim 2, wherein at least two of the optical amplification layers are formed of different semiconductor materials.

4. The optical amplifier of claim 3, wherein optical amplification of at least one of the optical amplification layers is provided by electrically injecting via the at least one electrode layer to excite electrons in the semiconductor materials from low energy level to high energy level.

5. The optical amplifier of claim 1, wherein each of the at least one electrode layer includes two electrodes respectively disposed over two sides of one of the optical amplification layers.

6. The optical amplifier of claim 1, wherein the at least one electrode layer is formed of an optically transparent material.

7. The optical amplifier of claim 1, wherein the porous structure includes a cross-shaped porous structure, or a stripped porous structure.

8. The optical amplifier of claim 1, wherein at least some of the optical amplification layers are arranged in a layer pattern, in a Bayer pattern, or in a mash pattern.

9. The optical amplifier of claim 1, further including:
an anti-reflection layer formed on a first end face of the optical amplifier, on which light is incident.

10. The optical amplifier of claim 1, further including:
an anti-reflection layer formed on a second end face of the optical amplifier, from which light is output.

11. The optical amplifier of claim 1, further including:
a mirror reflection layer formed on an end face of the optical amplifier.

12. The optical amplifier of claim 1, further including:
a partially reflection layer formed on a first end face of the optical amplifier, on which light is incident.

13. The optical amplifier of claim 1, further including:
a partially reflection layer formed on a second end face of the optical amplifier, from which light is output.

14. The optical amplifier of claim 1, wherein the first wavelength range does not overlap with the second wavelength range.

15. The optical amplifier of claim 1, wherein the second wavelength range and the first wavelength range at least partially overlap with each other.

16. An image capturing device, comprising:
imaging optics configured to focus light onto an image sensor; and
the optical amplifier of claim 1, wherein the image sensor is configured to receive and detect amplified by the optical amplifier.

17. The image capturing device of claim 16, wherein a center of the optical amplifier is aligned with a center of the image sensor.

18. The image capturing device of claim 16, wherein a plane of the optical amplifier is parallel to a plane of the image sensor.

19. The image capturing device of claim 16, wherein a plane of the optical amplifier and a plane of the image sensor form an angle.

* * * * *